(12) United States Patent
Suarez Arias

(10) Patent No.: US 11,233,166 B2
(45) Date of Patent: Jan. 25, 2022

(54) MONOLITHIC MULTIJUNCTION POWER CONVERTER

(71) Applicant: ARRAY PHOTONICS, INC., Tempe, AZ (US)

(72) Inventor: Ferran Suarez Arias, Chandler, AZ (US)

(73) Assignee: ARRAY PHOTONICS, INC., Tempe, AZ (US)

( * ) Notice: Subject to any disclaimer, the term of this patent is extended or adjusted under 35 U.S.C. 154(b) by 63 days.

(21) Appl. No.: 16/521,458

(22) Filed: Jul. 24, 2019

(65) Prior Publication Data

US 2019/0348562 A1 Nov. 14, 2019

Related U.S. Application Data

(63) Continuation of application No. 16/051,109, filed on Jul. 31, 2018, now abandoned, which is a continuation of application No. 14/614,601, filed on Feb. 5, 2015, now abandoned.

(60) Provisional application No. 61/936,222, filed on Feb. 5, 2014.

(51) Int. Cl.
| | |
|---|---|
| *H01L 31/0725* | (2012.01) |
| *H01L 31/054* | (2014.01) |
| *H01L 31/0216* | (2014.01) |
| *H01L 31/0224* | (2006.01) |

(Continued)

(52) U.S. Cl.
CPC .... *H01L 31/0725* (2013.01); *H01L 31/02168* (2013.01); *H01L 31/022433* (2013.01); *H01L 31/03046* (2013.01); *H01L 31/03048* (2013.01); *H01L 31/054* (2014.12);
(Continued)

(58) Field of Classification Search
CPC ............ H01L 31/0725; H01L 31/0547; H01L 31/02168; H01L 31/022433; H01L 31/03048; H01L 31/0687; H01L 31/054; H01L 31/03046; Y02E 10/544; Y02E 10/52

See application file for complete search history.

(56) References Cited

U.S. PATENT DOCUMENTS

| | | | |
|---|---|---|---|
| 4,127,862 | A | 11/1978 | Ilegems et al. |
| 4,179,702 | A | 12/1979 | Lamorte |
| 4,404,421 | A | 9/1983 | Fraas |

(Continued)

FOREIGN PATENT DOCUMENTS

| | | |
|---|---|---|
| CN | 1917241 A | 2/2007 |
| CN | 102280587 A | 12/2011 |

(Continued)

OTHER PUBLICATIONS

Unlu, Resonant cavity enhanced photonic devices, J. Appl. Phys. 78 (2), Jul. 15, 1995, pp. 607-639 (Year: 1995).*

(Continued)

*Primary Examiner* — Devina Pillay
(74) *Attorney, Agent, or Firm* — Morrison & Foerster LLP

(57) ABSTRACT

Resonant cavity power converters for converting radiation in the wavelength range from 1 micron to 1.55 micron are disclosed. The resonant cavity power converters can be formed from one or more lattice matched GaInNAsSb junctions and can include distributed Bragg reflectors and/or mirrored surfaces for increasing the power conversion efficiency.

13 Claims, 13 Drawing Sheets

(51) Int. Cl.
*H01L 31/0304* (2006.01)
*H01L 31/0687* (2012.01)

(52) U.S. Cl.
CPC ...... *H01L 31/0547* (2014.12); *H01L 31/0687* (2013.01); *Y02E 10/52* (2013.01); *Y02E 10/544* (2013.01)

(56) References Cited

U.S. PATENT DOCUMENTS

| | | | |
|---|---|---|---|
| 4,547,622 A | 10/1985 | Fan et al. | |
| 4,682,196 A | 7/1987 | Sakai et al. | |
| 4,881,979 A | 11/1989 | Lewis | |
| 4,935,384 A | 6/1990 | Wanlass | |
| 5,009,719 A | 4/1991 | Yoshida | |
| 5,016,562 A | 5/1991 | Madan et al. | |
| 5,166,761 A | 11/1992 | Olson et al. | |
| 5,223,043 A | 6/1993 | Olson et al. | |
| 5,316,593 A | 5/1994 | Olson et al. | |
| 5,342,453 A | 8/1994 | Olson et al. | |
| 5,376,185 A | 12/1994 | Wanlass | |
| 5,405,453 A | 4/1995 | Ho et al. | |
| 5,689,123 A | 11/1997 | Major et al. | |
| 5,800,630 A | 9/1998 | Vilela et al. | |
| 5,911,839 A | 6/1999 | Tsai et al. | |
| 5,935,345 A | 8/1999 | Kuznicki | |
| 5,944,913 A | 8/1999 | Hou et al. | |
| 6,069,353 A | 5/2000 | Jung et al. | |
| 6,150,603 A | 11/2000 | Karam et al. | |
| 6,252,287 B1 | 6/2001 | Kurtz et al. | |
| 6,281,426 B1 | 8/2001 | Olson et al. | |
| 6,340,788 B1 | 1/2002 | King et al. | |
| 6,504,091 B2 | 1/2003 | Hisamatsu et al. | |
| 6,617,618 B2 | 9/2003 | Sato | |
| 6,660,928 B1 | 12/2003 | Patton et al. | |
| 6,756,325 B2 | 6/2004 | Bour et al. | |
| 6,764,926 B2 | 7/2004 | Takeuchi et al. | |
| 6,765,238 B2 | 7/2004 | Chang et al. | |
| 6,787,385 B2 | 9/2004 | Barber et al. | |
| 6,815,736 B2 | 11/2004 | Mascarenhas | |
| 6,951,819 B2 | 10/2005 | Iles et al. | |
| 7,045,833 B2 | 5/2006 | Campbell et al. | |
| 7,071,407 B2 | 7/2006 | Faterni et al. | |
| 7,119,271 B2 | 10/2006 | King et al. | |
| 7,122,733 B2 | 10/2006 | Narayanan et al. | |
| 7,122,734 B2 | 10/2006 | Fetzer et al. | |
| 7,123,638 B2 | 10/2006 | Leary et al. | |
| 7,126,052 B2 | 10/2006 | Fetzer et al. | |
| 7,161,170 B1 | 1/2007 | Yoder | |
| 7,255,746 B2 | 8/2007 | Johnson et al. | |
| 7,279,732 B2 | 10/2007 | Meng et al. | |
| 7,473,941 B2 | 1/2009 | Lester | |
| 7,709,287 B2 | 5/2010 | Fatemi et al. | |
| 7,727,795 B2 | 6/2010 | Stan et al. | |
| 7,807,921 B2 | 10/2010 | Fetzer et al. | |
| 7,842,881 B2 | 11/2010 | Comfeld et al. | |
| 8,029,905 B2 | 10/2011 | Kouvetakis et al. | |
| 8,067,687 B2 | 11/2011 | Wanlass | |
| 8,093,559 B1 | 1/2012 | Rajavel | |
| 8,575,473 B2 | 11/2013 | Jones et al. | |
| 8,636,844 B1 | 1/2014 | Dargis et al. | |
| 8,697,481 B2 | 4/2014 | Jones-Albertus et al. | |
| 8,716,593 B2 | 5/2014 | Meusel et al. | |
| 8,809,673 B2 | 8/2014 | Lin | |
| 8,895,838 B1 | 11/2014 | Welser | |
| 8,912,433 B2 | 12/2014 | Jones et al. | |
| 8,957,376 B1 | 2/2015 | Tkachuk et al. | |
| 8,962,993 B2 | 2/2015 | Jones-Albertus et al. | |
| 9,018,521 B1 | 4/2015 | Cornfeld | |
| 9,018,522 B2 | 4/2015 | Jones-albertus | |
| 9,153,724 B2 | 10/2015 | Jones-Albertus et al. | |
| 9,214,580 B2 | 12/2015 | Misra et al. | |
| 9,240,514 B2 | 1/2016 | Gori et al. | |
| 9,252,313 B2 | 2/2016 | Meusel et al. | |
| 9,257,586 B2 | 2/2016 | Meusel et al. | |
| 9,502,598 B2 | 11/2016 | Meusel et al. | |
| 9,741,888 B2 | 8/2017 | Meusel et al. | |
| 9,748,426 B2 | 8/2017 | Meusel et al. | |
| 9,768,339 B2 | 9/2017 | Yanka et al. | |
| 10,355,159 B2 | 7/2019 | Misra | |
| 2002/0000546 A1 | 1/2002 | Sato | |
| 2002/0117675 A1 | 8/2002 | Mascarenhas | |
| 2002/0195137 A1 | 12/2002 | King et al. | |
| 2003/0047752 A1 | 3/2003 | Campbell et al. | |
| 2003/0070707 A1 | 4/2003 | King et al. | |
| 2003/0145884 A1 | 8/2003 | King et al. | |
| 2004/0045598 A1 | 3/2004 | Narayanan et al. | |
| 2004/0079408 A1 | 4/2004 | Fetzer | |
| 2004/0130002 A1 | 7/2004 | Weeks et al. | |
| 2004/0187912 A1 | 9/2004 | Takamoto | |
| 2004/0200523 A1 | 10/2004 | King et al. | |
| 2005/0139863 A1 | 6/2005 | Weiser et al. | |
| 2005/0155641 A1 | 7/2005 | Fafard | |
| 2005/0274409 A1 | 12/2005 | Fetzer et al. | |
| 2006/0048811 A1* | 3/2006 | Krut ................ H01L 31/109 136/249 |
| 2006/0144435 A1 | 7/2006 | Wanlass | |
| 2006/0162768 A1 | 7/2006 | Wanlass et al. | |
| 2007/0034853 A1 | 2/2007 | Robbins et al. | |
| 2007/0113887 A1 | 5/2007 | Laih et al. | |
| 2007/0131275 A1 | 6/2007 | Kinsey et al. | |
| 2007/0212510 A1 | 9/2007 | Hieslmair | |
| 2007/0227588 A1 | 10/2007 | Gossard et al. | |
| 2007/0246701 A1 | 10/2007 | Yanson | |
| 2008/0035939 A1 | 2/2008 | Puetz et al. | |
| 2008/0149173 A1 | 6/2008 | Sharps | |
| 2008/0245400 A1 | 10/2008 | Li | |
| 2008/0257405 A1 | 10/2008 | Sharps | |
| 2009/0001412 A1 | 1/2009 | Nagai et al. | |
| 2009/0014061 A1 | 1/2009 | Harris, Jr. | |
| 2009/0057721 A1 | 3/2009 | Miura et al. | |
| 2009/0078310 A1 | 3/2009 | Stan et al. | |
| 2009/0145476 A1 | 6/2009 | Fetzer et al. | |
| 2009/0155952 A1 | 6/2009 | Stan et al. | |
| 2009/0188561 A1 | 7/2009 | Aiken | |
| 2009/0218595 A1 | 9/2009 | Ishimura et al. | |
| 2009/0229659 A1 | 9/2009 | Wanlass et al. | |
| 2009/0255575 A1 | 10/2009 | Tischler | |
| 2009/0255576 A1 | 10/2009 | Tischler | |
| 2009/0272438 A1 | 11/2009 | Cornfeld | |
| 2009/0288703 A1 | 11/2009 | Stan et al. | |
| 2010/0072457 A1 | 3/2010 | Iguchi et al. | |
| 2010/0087028 A1 | 4/2010 | Porthouse et al. | |
| 2010/0096001 A1 | 4/2010 | Sivananthan et al. | |
| 2010/0096665 A1 | 4/2010 | MacDougal et al. | |
| 2010/0116318 A1 | 5/2010 | Sumida et al. | |
| 2010/0147366 A1 | 6/2010 | Stan et al. | |
| 2010/0180936 A1 | 7/2010 | Kim | |
| 2010/0186818 A1 | 7/2010 | Okorogu et al. | |
| 2010/0218819 A1 | 9/2010 | Farmer et al. | |
| 2010/0282305 A1 | 11/2010 | Sharps et al. | |
| 2010/0282306 A1 | 11/2010 | Sharps et al. | |
| 2010/0319764 A1 | 12/2010 | Wiemer et al. | |
| 2011/0023958 A1 | 2/2011 | Masson et al. | |
| 2011/0039400 A1 | 2/2011 | Yoon et al. | |
| 2011/0073973 A1 | 3/2011 | Nakaji et al. | |
| 2011/0114163 A1 | 5/2011 | Wiemer et al. | |
| 2011/0210313 A1 | 9/2011 | Fuji et al. | |
| 2011/0232730 A1* | 9/2011 | Jones ................ C30B 23/066 136/255 |
| 2011/0254052 A1 | 10/2011 | Kouvetakis et al. | |
| 2011/0291109 A1 | 12/2011 | Wraback et al. | |
| 2011/0303268 A1 | 12/2011 | tan et al. | |
| 2012/0031478 A1 | 2/2012 | Boisvert et al. | |
| 2012/0103403 A1 | 5/2012 | Misra et al. | |
| 2012/0153417 A1 | 6/2012 | Jin-Wei et al. | |
| 2012/0167965 A1 | 7/2012 | Lin et al. | |
| 2012/0211071 A1 | 8/2012 | Newman et al. | |
| 2012/0216858 A1 | 8/2012 | Jones-Albertus et al. | |
| 2012/0216862 A1 | 8/2012 | Abou-Kandil et al. | |
| 2012/0227797 A1 | 9/2012 | Stan et al. | |
| 2012/0255600 A1 | 10/2012 | Bedell | |
| 2012/0266803 A1 | 10/2012 | Zediker | |
| 2012/0285526 A1 | 11/2012 | Jones-Albertus et al. | |
| 2013/0014815 A1 | 1/2013 | Jones-Albertus et al. | |

(56) References Cited

U.S. PATENT DOCUMENTS

| | | |
|---|---|---|
| 2013/0074901 A1 | 3/2013 | Walukiewicz et al. |
| 2013/0112239 A1 | 5/2013 | Liptac et al. |
| 2013/0118546 A1 | 5/2013 | Jones-Albertus et al. |
| 2013/0118566 A1 | 5/2013 | Jones-Albertus et al. |
| 2013/0220409 A1 | 5/2013 | Jones-Albertus et al. |
| 2013/0344645 A1 | 12/2013 | Ahmari |
| 2014/0182667 A1 | 7/2014 | Richards et al. |
| 2014/0261653 A1 | 9/2014 | Krause et al. |
| 2014/0290737 A1 | 10/2014 | Javey et al. |
| 2014/0326300 A1 | 11/2014 | Fuhrmann |
| 2015/0187971 A1 | 7/2015 | Sweeney et al. |
| 2015/0214412 A1 | 7/2015 | Jones-Albertus et al. |
| 2015/0221803 A1 | 8/2015 | Suarez et al. |
| 2015/0357501 A1 | 12/2015 | Derkacs et al. |
| 2016/0005909 A1 | 1/2016 | Newman |
| 2016/0118526 A1 | 4/2016 | Misra et al. |
| 2016/0190376 A1 | 6/2016 | Campesato et al. |
| 2016/0300973 A1 | 10/2016 | Shen et al. |
| 2016/0372624 A1 | 12/2016 | Yanka et al. |
| 2017/0036572 A1 | 2/2017 | Hansen et al. |
| 2017/0110607 A1 | 4/2017 | Jones-albertus et al. |
| 2017/0110613 A1 | 4/2017 | Suarez et al. |
| 2017/0200845 A1 | 7/2017 | King et al. |
| 2017/0271542 A1 | 9/2017 | Fafard et al. |
| 2017/0338357 A1 | 11/2017 | Liu et al. |
| 2018/0337301 A1 | 11/2018 | Suarez Arias |
| 2019/0013430 A1 | 1/2019 | Jones-albertus |
| 2019/0252567 A1 | 8/2019 | Yoon et al. |
| 2019/0348562 A1 | 11/2019 | Suarez Arias |
| 2020/0212237 A1 | 7/2020 | Roucka |

FOREIGN PATENT DOCUMENTS

| | | |
|---|---|---|
| CN | 102829884 A | 12/2012 |
| CN | 103426965 A | 12/2013 |
| CN | 104282793 A | 1/2015 |
| CN | 106711253 A | 5/2017 |
| CN | 107644921 A | 1/2018 |
| EP | 595634 B1 | 5/1994 |
| EP | 3159935 A2 | 4/2017 |
| JP | 63100781 A | 5/1988 |
| JP | 6061513 A | 3/1994 |
| JP | 6061516 A | 3/1994 |
| JP | 10012905 A | 1/1998 |
| JP | 2006-270060 A | 10/2006 |
| JP | 2008-270760 A | 11/2008 |
| TW | 200721518 A | 6/2007 |
| TW | 200924214 A | 6/2009 |
| TW | 200933913 A | 8/2009 |
| TW | 201131788 A | 9/2011 |
| TW | 201228004 A | 7/2012 |
| TW | 201316382 A | 4/2013 |
| TW | 201436252 A | 9/2014 |
| WO | 2010/130421 A1 | 11/2010 |
| WO | 2010/151553 A1 | 12/2010 |
| WO | 2011/062886 A1 | 5/2011 |
| WO | 2011/123164 A1 | 10/2011 |
| WO | 2012/057874 A1 | 5/2012 |
| WO | 2012/115838 A1 | 8/2012 |
| WO | 2012/154455 A1 | 11/2012 |
| WO | 2018/078348 A1 | 5/2018 |
| WO | 2019/067553 A1 | 4/2019 |
| WO | 2020247691 A1 | 12/2020 |

OTHER PUBLICATIONS

Andreev et al., "High Current Density GaAs and GaSb Photovoltaic Cells for Laser Power Beaming", 3rd World Conference on Photovoltaic Energy conversion, May 11-18, 2003, Osaka, Japan, 4 pages.
Asbeck et al., "Heterojunction bipolar transistors implemented with GaInNAs materials," Semiconductor Science and Technology, vol. 17, No. 8, pp. 898-906, Jul. 2002.
Chang, S.J. et al., "Chirped GaAs-AIAs Distributed Bragg Reflectors for High Brightness Yellow-Green Light-Emitting Diodes," Photonics Technology Letters, Feb. 1997, vol. 9, No. 2, p. 182-184.
Chen et al., "GaAsSbN/GaAs long wavelength PIN detectors," Indium Phosphide and Related Materials, 2008, 20th International Conference on Versailles, 4 pages.
European Search Report for Application No. 10849171.3, dated Aug. 9, 2016, 10 pages.
European Search Report for Application No. 10849171.3, dated Jun. 1, 2017, 8 pages.
European Search Report for Application No. 16194680.1, dated May 29, 2017, 16 pages.
Ferguson et al., "Optical Gain in GaInNAs and GaInNAsSb Quantum Wells," IEEE Journal of Quantum Electronics, Jun. 2011, vol. 47, No. 6, 8 pages.
Final Office Action for U.S. Appl. No. 12/819,534, dated Sep. 9, 2013, 13 pages.
Final Office Action for U.S. Appl. No. 13/894,245, dated May 16, 2018, 14 pages.
Final Office Action for U.S. Appl. No. 13/894,254, dated May 19, 2017, 17 pages.
Final Office Action for U.S. Appl. No. 14/614,601, dated May 17, 2018, 13 pages.
Final Office Action for U.S. Appl. No. 14/887,021, dated Mar. 9, 2018, 11 pages.
Final Office Action for U.S. Appl. No. 14/887,021, dated Nov. 18, 2016, 22 pages.
Final Office Action for U.S. Appl. No. 14/935,145, dated Apr. 20, 2018, 25 pages.
Final Office Action for U.S. Appl. No. 14/935,145, dated Oct. 25, 2016, 28 pages.
Final Office Action for U.S. Appl. No. 16/018,917, dated Mar. 22, 2019, 20 pages.
Final Office Action for U.S. Appl. No. 16/051,109, dated Feb. 1, 2019, 11 pages.
Final Office Action for U.S. Appl. No. 12/217,818, dated Jan. 11, 2011, 10 pages.
Final Office Action for U.S. Appl. No. 12/914,710, dated Sep. 6, 2013, 17 pages.
Final Office Action for U.S. Appl. No. 13/104,913, dated Oct. 2, 2013, 12 pages.
Final Office Action for U.S. Appl. No. 13/739,989, dated Feb. 26, 2014, 15 pages.
Final Office Action dated Jun. 5, 2019, for U.S. Appl. No. 16/132,059, filed Sep. 14, 2018, fourteen pages.
Final Office Action dated Sep. 27, 2019, for U.S. Appl. No. 16/132,059, filed Sep. 14, 2018, twenty four pages.
Green et al., "Solar cell efficiency tables (Version 38)," Progress in Photovoltaics: Research and Applications, 2011, vol. 19, p. 565-572.
Green et al., "Solar cell efficiency tables (Version 39)," Progress in Photovoltaics: Research and Applications, 2012, vol. 20, p. 12-20.
Guter et al., "Current-matched triple-junction solar cell reaching 41.1% conversion efficiency under concentrated sunlight," Applied Physics Letters, Jun. 2009, vol. 94, No. 22, p. 223504.
International Preliminary Report on Patentability for PCT Application No. PCT/US2011/036486, dated Apr. 30, 2013.
International Preliminary Report on Patentability for PCT Application No. PCT/US2017/032712, dated Dec. 2018, 10 pages.
International Search Report and Written Opinion corresponding to the PCT application No. PCT/US/1136486, dated Aug. 25, 2011, 16 pages.
International Search Report and Written Opinion corresponding to the PCT application No. PCT/US2010/039534, dated Sep. 8, 2010, 8 pages.
International Search Report and Written Opinion for Application No. PCT/US2017/032712, dated Aug. 2, 2017, 14 pages.
International Search Report and Written Opinion for PCT Application No. PCT/US2016/056437, dated Mar. 20, 2017, 22 pages.
International Search Report and Written Opinion for PCT/US/2036208, dated Sep. 8, 2020, twelve pages.
International Search Report and Written Opinion of the International Searching Authority for PCT Application No. PCT/US/201225307, dated Aug. 16, 2012, 13 pages.

(56) References Cited

OTHER PUBLICATIONS

International Search Report and Written Opinion of the International Searching Authority for PCT Application No. PCT/US/201236020, dated Aug. 14, 2012, 11 pages.
Jackrel et al., "Dilute Nitride GaInNAs and GaInNAsSb Solar Cells by Molecular Beam Epitaxy," Journal of Applied Physics, 2007, vol. 101, p. 114916.
Jackrel et al., "GaInNAsSb Solar Cells Grown by Molecular Beam Epitaxy," 2006. Photovoltaic Energy Conversion, Conference Record of the 2006 IEEE 4th World Conference, vol. 1, p. 783-786, May 2006.
Non-Final Office Action for U.S. Appl. No. 13/708,763, dated Apr. 15, 2013, 23 pages.
Non-Final Office Action for U.S. Appl. No. 13/894,245, dated Jan. 8, 2018, 18 pages.
Non-Final Office Action for U.S. Appl. No. 14/614,601, dated Jan. 23, 2017, 10 pages.
Non-Final Office Action for U.S. Appl. No. 14/887,021, dated Jul. 20, 2017, 10 pages.
Non-Final Office Action for U.S. Appl. No. 14/887,021, dated Jun. 15, 2018, 9 pages.
Non-Final Office Action for U.S. Appl. No. 14/935,145, dated Nov. 30, 2018, 7 pages.
Non-Final Office Action for U.S. Appl. No. 14/935,145, dated Sep. 22, 2017, 33 pages.
Non-Final Office Action for U.S. Appl. No. 14/979,899, dated Jul. 1, 2016, 10 pages.
Non-Final Office Action for U.S. Appl. No. 15/391,659, dated Jul. 27, 2017, 6 pages.
Non-Final Office Action for U.S. Appl. No. 15/595,391, dated Mar. 5, 2019, 14 pages.
Non-Final Office Action for U.S. Appl. No. 16/018,917, dated Oct. 16, 2018, 11 pages.
Non-Final Office Action for U.S. Appl. No. 16/018,917, dated Sep. 5, 2019, 30 pages.
Non-Final Office Action for U.S. Appl. No. 16/051,109, dated Oct. 30, 2018, 11 pages.
Non-Final Office Action for U.S. Appl. No. 12/217,818, dated Jun. 10, 2010, 9 pages.
Non-Final Office Action for U.S. Appl. No. 12/819,534, dated Feb. 21, 2013, 8 pages.
Non-Final Office Action for U.S. Appl. No. 12/819,534, dated Sep. 16, 2015, 9 pages.
Non-Final Office Action for U.S. Appl. No. 13/370,500, dated Dec. 31, 2013, 6 pages.
Non-Final Office Action for U.S. Appl. No. 13/442,146, dated Mar. 21, 2014, 5 pages.
Non-Final Office Action for U.S. Appl. No. 13/678,389, dated Feb. 20, 2014, 12 pages.
Non-Final Office Action for U.S. Appl. No. 13/678,389, dated Jul. 6, 2015, 11 pages.
Non-Final Office Action for U.S. Appl. No. 13/739,989, dated May 15, 2013, 7 pages.
Non-Final Office Action for U.S. Appl. No. 13/894,245, dated Jun. 24, 2015, 19 pages.
Non-Final Office Action for U.S. Appl. No. 13/819,534, dated Sep. 21, 2016, six pages.
Non-Final Office Action for U.S. Appl. No. 14/678,737, dated Jul. 6, 2015, 13 pages.
Non-Final Office Action dated Oct. 31, 2018, for U.S. Appl. No. 16/132,059, filed Sep. 14, 2018, twenty pages.
Non-Final Office Action dated Jun. 5, 2020, for U.S. Appl. No. 16/103,204, filed Aug. 14, 2018, twenty six pages.
Notice of Allowance for U.S. Appl. No. 13/370,500, dated Sep. 22, 2014, ten pages.
Notice of Allowance for U.S. Appl. No. 13/442,146, dated Jul. 7, 2015, 7 pages.
Notice of Allowance for U.S. Appl. No. 13/739,989, dated Sep. 30, 2014, 9 pages.
Office Action for European Application No. 18208211.5, dated Mar. 6, 2020, 5 pages.
Office Action for German Application No. 112011103244.7, dated Feb. 20, 2020, 5 pages (translation).
Partial European Search Report for Application No. EP 16194680, dated Feb. 15, 2017, 8 pages.
Ptak et al., "Effects of Bismuth on Wide-Depletion-Width GaInNAs Solar Cells," Journal of Vacuum Science and Technology, 2008, vol. 26, No. 3, p. 1053-1057.
Sabnis et al., "High-Efficiency Multijunction Solar Cells Employing Dilute Nitrides," 8th International Conference on Concentrating Photovoltaic Systems, AIP Conference Proceedings, Oct. 2012, vol. 1477, p. 14-19.
Search Report for European Application No. 18/208,211, dated Feb. 18, 2019, 7 pages.
Search Report for Singapore Application No. 102015033865, dated Feb. 16, 2017, 6 pages.
Search Report for Taiwan Application No. 101116335, dated Dec. 5, 2016, one page.
Search Report for Taiwan Application No. 105133762, dated Jul. 12, 2017, one page.
Takamoto et al., "InGaP/GaAs-based multijunction solar cells," Progress in Photovoltaics: Research and Applications, Sep. 2005, vol. 13, No. 6, p. 495-511.
U.S. Appl. No. 12/819,534, Final Office Action dated Jan. 20, 2016.
U.S. Appl. No. 13/678,389, Final Office Action dated Feb. 4, 2016.
U.S. Appl. No. 13/678,389, Non-Final Office Action dated Sep. 16, 2016.
U.S. Appl. No. 13/894,245, Final Office Action dated Feb. 5, 2016.
U.S. Appl. No. 13/894,245, Non-Final Office Action dated Sep. 7, 2016.
U.S. Appl. No. 14/887,021, Non-Final Office Action dated Feb. 18, 2016.
U.S. Appl. No. 14/887,021, Non-Final Office Action dated May 24, 2016.
U.S. Appl. No. 14/935,145, Non-Final Office Action dated Mar. 17, 2016.
Yuen, "The role of antimony on properties of widely varying GaInNAsSb compositions", Journal of Applied Physics, May 2006, vol. 99, p. 093504-1 to 093804-8.
David et al., "Material Considerations for Avalanche Photodiodes," IEEE Journal of Selected Topics in Quantum Electronics, Jul./Aug. 2008, vol. 14, No. 4, p. 998-1009.
Heroux et al., "Dilute Nitride Photodetector and Modulator Devices," Dilute III-V Nitride Semiconductors and Material Systems, Materials Science, Jan. 2008, vol. 105, pp. 563-586.
Kinsey et al., "GaNAs resonant-cavity avalanche photodiode operating at 1.064 um," Applied Physics Letters, Sep. 2000, vol. 77, No. 10, p. 1543-1544.
Mawst et al., "Dilute-Nitride-Antimonide Materials Grown by MOVPE for Multi-Junction Solar Cell Application," The Electrochemical Society, 2015, vol. 66, No. 7, p. 101-108.
Ng et al., "InGaAsN as Absorber in APDs for 1.3 micron Wavelength Applications," Indium Phosphide & Related Materials, 2010 International Conference, May 2010, p. 1-4.
International Search Report and Written Opinion for PCT Application No. PCT/US2019/036857, dated Aug. 23, 2019, 18 pages.
Examination Report for European Application No. 15704681.4, dated Sep. 3, 2019, 7 pages.
Non-Final Office Action for U.S. Appl. No. 16/018,917, dated Sep. 5, 2019, 31 pages.
Edmund. "Dichroic Longpass Filters", Edmund Optics Worldwide, Product Catalog, Feb. 2001, 9 pages, retrieved from https://www.edmundoptics.com/t/dichroic-longpass-filters/14288/.
Langer et al., "Graded band gap GaInNAs solar cells", Applied Physics Letters, 2015, vol. 106, p. 233902.
Magden et al., "Transmissive silicon photonic dichroic filters with spectrally selective eaveguides", Nature Communications, Aug. 2019, 10 pages, retrieved from https://www.nature.com/articles/s41467-018-05287-1.
Thorlabs. "Longpass Dichroic Mirrors/Beamsplitters", Product Description, Sep. 29, 2008, 15 pages, retrieved from https://www.thorlabs.com/newgrouppage9.cfm?objectgroup_id:3313.

(56) References Cited

OTHER PUBLICATIONS

International Search Report for PCT Application No. PCT/US2019/048533, dated Jan. 2, 2020, 10 pages.
Aho et al., "Determination of Composition and Energy Gaps of GaInNAsSb Layers Grown by MBE," Journal of Crystal Growth, 2016, vol. 438, p. 49-54.
Aho., "Dilute Nitride Multijunction Solar Cells Grown by Molecular Beam Epitaxy," Ph.D. Dissertation, Tampere University of Technology, Nov. 2015, vol. 1343, p. 44.
Aho., "Dilute Nitride Multijunction Solar Cells Grown by Molecular Beam Epitaxy", PhD Dissertation, Tampere University of Technology, Publication, vol. 1343, Nov. 14, 2015, XP055524070, pp. 1-80.
Baghdasaryan, H.V. et al., "Wavelength-Scale Analysis of Influence of Chirped DBRs on Optical Characteristics of Multinanolayer Photovoltaic Cells," ICTON 2016, We.P.33, 5 pages.
Bank, et al., "Molecular-beam epitaxy growth of low-threshold cw GainNAsSb lasers at 1.5 μm," pp. 1337-1340, J. Vac. Sci. Technol. B 23(3), May/Jun. 2005.
Bank et al., "Recent Progress on 1.55-um Dilute-Nitride Lasers," IEEE Journal of Quantum Electronics, Sep. 2007, vol. 43, No. 9, 13 pages.
Baranowski et al., "Time-resolved photoluminescence studies of annealed 1.3-um GaInNAsSb quantum wells," Nanoscale Research Lettesr, 2014, vol. 9, No. 81, 5 pages.
Baribeau et al., "Heteroepitaxy of Ge on (100) Si substrates," Journal of Vacuum Science & Technology, Jul./Aug. 1987, A 5 (4), 6 pages.
Bertness et al., "29.5%-Efficient GaInP/GaAs Tandem Solar Cells," Applied Physics Letters, vol. 65, Aug. 22, 1994, pp. 989-991.
Bett et al., "III-V Solar Cells Under Monochromatic Illumination", IEEE transactions on Electron Devices, 2008, 5 pages.
Bhuiyan et al., "InGaN Solar Cells: Present State of the Art and Important Challenges", IEEE Journal of Photovoltaics, vol. 2, No. 3, Jul. 2012, p. 246-293.
Campesato et al., "31 % European InGaP/GaAs/InGaNAs Solar Cells for Space Application," E3S Web of Conferences, 2017, vol. 16, 5 pages.
Cheah et al., "GaAs-Based Heterojunction p-i-n Photodetectors Using Pentanary InGaAsNSb as the Intrinsic Layer," IEEE Photonics Technology Letters, Sep. 2005, vol. 17, No. 9, 3 pages.
Cornfeld et al., "Evolution of a 2.05 eV AIGaInP Top Sub-cell for 5 and 6J-IMM Applications", Photovoltaic Specialists Conference (PVSC), 38th IEEE, Jun. 3, 2012, p. 2788-2791.
Cotal et al., "III-V multijunction solar cells for concentrating photovoltaics" pp. 174-192, www.rsc.org/ees, Energy and Environmental Science 2, (2009).
Dargis et al., "Growth and application of epitaxial heterostructures with polymorphous rare-earth oxides," Journal of Crystal Growth, 2013, vol. 378, p. 177-179.
Dargis et al., "Monolithic integration of rare-earth oxides and semiconductors for on-silicon technology," J. Vac. Sci. Tech., Aug. 2014, vol. 32, No. 4, p. 041506.
Denton et al., Vegard's Law, Physical Review, A, The American Physical Society, vol. 43 No. 6, pp. 3161-3164 (1991).
Ferguson et al., Nonradiative Recombination in 1.56 pm GaInNAsSb/GaNAs Quantum-Well Lasers, pp. 1-3, published online Dec. 8, 2009, Applied Physics Letters 95, 231104.
Fewster P.F., "X-Ray Scattering From Semiconductors" Second Edition, Imperial College Press, London, 2003, Ch. 1, pp. 1-22.
Fitzgerald et al., "Dislocations in Relaxed SiGe/Si Heterostructures," Phys. Stat. Sol., 1999, vol. 171, p. 227-238.
Friedman et al., "1-eV Solar cells with GaInNAs active layer", Journal of Crystal Growth, vol. 195, 1998, p. 409-415.
Friedman et al., "Analysis of the GaInP/GaAs/1-eV/Ge Cell and Related Structures for Terrestrial Concentration Application," pp. 856-859, Conference Record of the Twenty-ninth IEEE Photovoltaic Specialists Conference, New Orleans, LA., May 19-24, 2002.
Friedman et al., Breakeven Criteria for the GaInNAs Junction in GaInP/GaAs/GaInNAs/Ge Four-junction Solar Cells, pp. 331-344, Progress in Photovoltaics: Research and Applications. (2002).
Friedman et al., "Analysis of Depletion-Region Collection in GaInNAs Solar Cells," pp. 691-694, Conference Record of the Thirty-first IEEE Photovoltaic Specialists Conference, Lake Buena Vista, Florida, Jan. 3-7, 2005.
Garcia, I. et al., "Design of Semiconductor-Based Back Reflectors for High Voc Monolithic Multijunction Solar Cells," IEEE Photovoltaic Specialists Conference, Austin Texas, Jun. 3-8, 2012, 8 pages.
Garcia et al., Analysis of Tellurium as N-Type Dopant in GaInP: Doping, Diffusion, Memory Effect and Surfactant Properties, pp. 794-799, Journal of Crystal Growth 298 (2007).
Garcia et al., "Degradation of subcells and tunnel junctions during growth of GaInP/Ga(In)As/GaNAsSb/Ge 4-junction solar cells," Progress in Photovoltaics, Aug. 2017, 9 pages.
Geelen et al., Epitaxial Lift-Off GaAs Solar Cell From a Reusable GaAs Substrate, pp. 162-171, Materials Science and Engineering B45 (1997).
Geisz et al., "Inverted GaInP / (In)GaAs / InGaAs triple-junction solar cells with low-stress metamorphic bottom junctions," Proceedings of the 33rd IEEE PVSC Photovoltaics Specialists Conference, (2008).
Gobet et al., "GaInNAsSb/GaAs vertical cavity surface-emitting lasers (VCSELs): Current challenges and techniques to realize multiple-wavelength laser arrays at 1.55um," Proc. of SPIE, Feb. 2008, vol. 6908, 13 pages.
Green et al., Progress in Photovoltaics: Research and Applications 19 (2011) pp. 565-572.
Green et al., Progress in Photovoltaics: Research and Applications 20 (2012) pp. 12-20.
Green, "Third Generation Photovoltaics: Advanced Solar Energy Conversion," pp. 95-109, Springer Publishing, Berlin, Germany (2003).
Green, Do Built-in Fields Improve Solar Cell Performance? pp. 57-66, Progress in Photovoltaics: Research and Applications (2009), Published online in Wiley InterScience (www.interscience.wiley.com) on Oct. 1, 2008.
Gu et al., "Gas Source Growth and Doping Characteristics of AlInP on GaAs" Materials Science and Engineering B 131 (2006), pp. 49-53.
Gubanov et al., "Dynamic of time-resolved photoluminescence in GaInNAs and GaNAsSb solar cells," Nanoscale Research Letters, 2014, vol. 9, No. 80, 4 pages.
Han et al., "1.55 um GaInNAs resonant-cavity-enhanced photodetector grown on GaAs," Applied Physics Letters, 2005, vol. 87, 111105.
Harris Jr. et al., "Development of GainNAsSb alloys: Growth, band structure, optical properties and applications," 2007, Physics Status Solidi(b), vol. 244, Issue 8, p. 2707-2729.
Harris Jr. et al., "The opportunities, successes and challenges for GaInNAsSb," Journal of Crystal Growth, Mar. 2005, vol. 278, p. 3-17.
Heroux et al., "GaInNAs resonant-cavity-enhanced photodetector operating at 1.3 um," Applied Physics Letters, Nov. 1999, vol. 75, No. 18, p. 2716-2718.
Hovel H.J., "Semiconductors and Semimetals", Academic Press, New York, 1975, Ch. 2, pp. 8-47.
Huang, Jie et al., "Four-junction AIGaAs/GaAs laser power converter," Journal of Semiconductors, Apr. 2018, vol. 39, No. 4, 044003, 5 pages.
Jackrel et al., "Thick lattice-matched GaInNAs films in photodetector applications," Proc. of SPIE, 2005, vol. 5728, p. 27-34.
Jackrel, D. B., "InGaAs and GaInNAs(Sb) 1064 NM Photodectectors and Solar Cells on GaAs Substrates," A Dissertation submitted to the Department of Materials Science and Engineering and the Committee on Graduate Studies of Stanford University, 2005, 264 pages.
Jackrel et al., "GaInNAsSb Solar Cells Grown by Molecular Beam Epitaxy," pp. 1-16, IEEE 4th World Conference on Photovoltaic Energy Conversion, Waikoloa, HI, 2006.

(56) References Cited

OTHER PUBLICATIONS

Jackrel et al., "Dilute nitride GaInNAs and GaInNAsSb solar cells by molecular beam epitaxy", Journal of Applied Physics 2007, 101, p. 114916.
Janotti et al., Mutual Passivation of Electrically Active and Isovalent Impurities in Dilute Nitrides, Physical Review Letters 100, 045505 (2008).
Janotti et al., "Effects of Hydrogen on the Electronic Properties of Dilute GaAsN Alloys," The American Chemical Society, Aug. 2002, vol. 89, No. 8, p. 086403.
Ketlhwaafetse, Richard, "Comparative Study of Dilute Nitride and Bismide Sub-Junctions for Tandem Solar Cells," A thesis for Ph.D. in applied physics, University of Essex, Jan. 2016, 175 pages.
Khalil et al., "Photoconductivity and photoluminescence under bias in GaInNAs/GaAs MQW p-i-n structures," Nanoscale Research Letter, 2012, vol. 7, No. 539, 4 pages.
Kim et al., "Characteristics of bulk InGaInNAs and InGaAsSbN materials grown by metal organic vapor phase epitaxy (MOVPE) for solar cell application," Proc. of SPIE, 2012, vol. 8256, 8 pages.
Kim et al., "Characteristics of bulk InGaAsSbN/GaAs grown by metalorganic vapor phase epitaxy (MOVPE)," Journal of Crystal Growth, 2013, p. 163-167.
King et al., "High-Voltage, Low-Current GaInP/GaInP/GaAs/GaInNAs/Ge Solar Cells" Spectrolab Inc., 2002, pp. 852-855.
King et al., "40% Efficient Metamorphic GaInP/GaInAs/Ge Multijunction Solar Cells," J. of Applied Physics Letters, May 4, 2007.
Kudrawiec, "Contactless electroreflectance of GaInNAsSb/GaAs single quantum wells with indium content of 8%-32%", Jan. 2007, Journal of Applied Physics, vol. 101, p. 013504-1-013504-9.
Kudrawiec et al., "Band Gap Discontinuity in Ga0.9In0.1N0.027As0.973-xSbx/GaAs Single Quantum Wells with 0<x<0.06 Studied by Contactless Electroreflectance Spectroscopy", Applied Physics Letters, 2006, vol. 88, p. 221113.
Kurtz et al., "Understanding the potential and limitations of dilute nitride alloys for solar cells", Paper No. NREL/CP-520-38998, DOE Solar Energy Technologies Conference, Denver, CO, Nov. 7-10, 2005, 5 pages.
Kurtz et al., "Projected Performance of Three and Four-Junction Devices Using GaAs and GaInP," pp. 875-878, 26th IEEE Photovoltaics Specialists Conference, 1997.
Law et al., "Future technology pathways of terrestrial III-V multijunction solar cells for concentrator photovoltaic systems," Solar Energy Materials & Solar Cells 94 (2010) pp. 1314-1318.
Le Du et al., "Quantum-well saturable absorber at 1.55 um on GaAs substrate with a fast recombination rate," Applied Physics Letters, 2006, vol. 88, 201110.
Loke, W.K. et al., "Improvement of GaInNAs p-i-n photodetector responsivity by antimony incorporation," Journal of Applied Physics, 2007, vol. 101, p. 033122.
Merrill et al., Directions and Materials Challenges in High Performance Photovoltaics, Dec. 2007, JOM Energetic Thin Films, 59, 12, 26-30.
Miller et al., "GaAs-AlGaAs tunnel junctions for multigap cascade solar cells", Journal of Applied Physics, vol. 53, No. 1, Jan. 1982, p. 744-748.
Miyashita, N., et al., "Incorporation of Hydrogen into MBE-Grown Dilute Nitride GaInNAsSb Layers in a MOCVD Growth Ambient", Solar Energy Materials and Solar Cells, vol. 185, 2018, pp. 359-363.
Miyashita et al., "Generation and collection of photocarriers in dilute nitride GaInNAsSb solar cells," Progress in Photovoltaics: Research and Applications, 2016, vol. 24, p. 28-37.
Miyashita et al., Effect of Indium Composition on GaInNAsSb Solar Cells Grown by Atomic Hydrogen-Assisted Molecular Beam Epitaxy, pp. 000632-000635, 978-1-4244-2950® 2009 IEEE.
Miyashita et al., "Improvement of GaInNAsSb films fabricated by atomic hydrogen-assisted molecular beam epitaxy", pp. 3249-3251, Journal of Crystal Growth 311, 2009.
Miyashita, N. et al., "Characterization of 1.0 EV GaInNAsSb Solar Cells for Multijunction Applications and the Effect of Annealing," 31st European Photovoltaic Solar Energy Conference and Exhibition, Sep. 2015, p. 1461-1465.
Ng et al., "Long wavelength bulk GaInNAs p-i-n photodiodes lattice matched to GaAs," Journal of Applied Physics, 2007, vol. 101, 064506, 6 pages.
Ng et al., "Molecular beam epitaxy growth of bulk GaNAsSb on Ge/graded-SiGe/Si substrate," Journal of Crystal Growth, 2009, vol. 311, p. 1754-1757.
Ng et al., 1EV GANXAS1-X-YSBY Material For Lattice-Matched III-V Solar Cell Implementation on GAAS and GE, pp. 76-80, (2009).
Ni et al., "Optimization of GaInNAs(Sb)/GaAs quantum wells at 1.3-1.55 um grown by molecular beam epitaxy," Journal of Crystal Growth, 2007, vol. 301-302, p. 125-128.
Niu et al., "GaAs-based room-temperature continuous-wave 1.59um GaInNAsSb single-quantum-well laser diode grown by molecular-beam epitaxy," Applied Physics Letters, Dec. 2005, vol. 87, No. 23, 4 pages.
Ochoa, M. et al., "Advances Towards 4J Lattice-Matched including Dilute Nitride Subcell for Terrestrial and Space Applications," 43rd Photovoltaic Specialists Conference, 2016, p. 52-57.
Ohnaka et al., "A Low Dark Current InGaAs/InP p-i-n Photodiode with Covered Mesa Structure," IEEE Transactions on Electron Devices, Feb. 1987, vol. Ed-34, No. 2, 6 pages.
Olson J.M. et al., "High-Efficiency III-V Multijunction Solar Cells" Handbook of Photovoltaic Science and Engineering, 1st ed.; Luque, A., Hegedus, S., Eds.; Wiley: New York, NY, USA, 2003; Chapter 9, pp. 359-411.
Patton et al., "Development of a High Efficiency Metamorphic Triple-junction 2.1 eV/1.6 eV/1.2 eV AlGaInP/InGaAsP/InGaAs Space Solar Cell", Conference Record of the IEEE Photovoltaic Specialists Conference, Institute of Electrical and Electronics Engineers Inc., May 19, 2002, vol. 29, p. 1027-1030.
Pena et al., "The Influence of Monolithic Series Connection on the Efficiency of GaAs Photovoltaic Converters for Monochromatic Illumination," Transactions on Electron Devices, Feb. 2001, vol. 48, No. 2, p. 196-203.
Polojarvi et al., "Comparative study of defect levels in GaInNAs, GaNAsSb, and GaInNAsSb for high-efficiency solar cells," Applied Physics Letters, 2016, vol. 108, p. 122104.
Ptak et al., "A comparison of MBE- and MOCVD-grown GaInNAs," Journal of Crystal Growth, 2003, vol. 251, p. 392-398.
Ptak et al., "Effects of Temperature, Nitrogen Ions and Antimony on Wide Depletion Width GaInNAs," pp. 955-959.J. Vac. Sci. Tech. B25(3), May/Jun. 2007 (published May 31, 2007).
Ptak et al., "Low-acceptor-Concentration GaInNAs grown by Molecular-beam Epitaxy for High-current p-i-n solar cell applications." J. of Applied Physics, 98.094501 (2005).
Ptak et al., "Defects in GaInNAs: What We've Learned so Far" National Renewable Energy Laboratory NREL/CP-520-33555, May 2003, 7 pages.
Sabnis et al., A new roadmap for space solar cells, Industry Photovoltaics, www.compoundsemiconductor.net/csc/features-details/19735471, Aug./Sep. 2012, 5 pages.
Saka, T. et al., "Bragg reflector of GaAlAs/AlAs layers with wide bandwidth applicable to light emitting diodes," Journal of Applied Physics, 1993, vol. 73, No. 380, p. 380-383.
Schubert et al., "High-Voltage GaAs Photovoltaic Laser Power Converters", IEEE transactions on Electron Devices, Feb. 2009, vol. 56, No. 2, p. 170-175.
Sin et al., "Carrier Dynamics in MOVPE-Grown Bulk Dilute Nitride Materials for Multi-Junction Solar Cells," Proc. of SPIE, 2011, vol. 7933, 11 pages.
Solar Junction Inc., "Sharp Develops Solar Cell with Word's Highest Conversion Efficiency of 35.8%" Press Release, dated Oct. 22, 2009, 3 pages.
Suarez, F., et al., "Advances in Dilute Nitride Multi-Junction Solar Cells for Space Power Applications", Proceedings of the 11th European Space Power Conference 2016 (ESPC 2016), Published May 23, 2017, 3 pages.

(56) References Cited

OTHER PUBLICATIONS

Takeda et al., "Electron mobility and energy gap of In0.53 Ga0.47As on InP substrate," Journal of Applied Physics, Dec. 1976, vol. 47, No. 12, p. 5405-5408.

Tan et al., "Reduction of dark current and unintentional background doping in InGaAsN photodetectors by ex situ annealing," Proc. of SPIE, 2010, vol. 7726, 8 pages.

Tan et al., "Molecular beam epitaxy grown GaNAsSb 1 eV photovoltaic cell," Journal of Crystal Growth, 2011, vol. 335, p. 66-69.

Tan et al., "GaInNAsSb/GaAs Photodiodes for Long-Wavelength Applications," Electron-Device Letters, Jul. 2011, vol. 32, No. 7, p. 919-921.

Tan et al., "Dilute nitride GaInNAs and GaInNAsSb for solar cell applications," Proc. of SPIE, 2012, vol. 8256, 10 pages.

Tan et al., "Improved Optoelectronic Properties of Rapid Thermally Annealed Dilute Nitride GaInNAs Photodetectors," Journal of Electronic Materials, 2012, vol. 41, No. 12, p. 3393-3401.

Tan et al., "High responsivity GaNAsSb p-i-n photodetectors at 1.3um growth by radio-frequency nitrogen plasma-assisted molecular beam epitaxy," Optics Express, May 2008, vol. 16, No. 11, p. 7720-7725.

Tan et al., "Experimental evaluation of impact ionization in dilute nitride GaInNAs diodes," Applied Physics Letters, 2013, vol. 103, p. 102101.

Tobin, S.P. et al., "Enhanced Light Absorption in GaAs Solar Cells with Internal Bragg Reflectors," IEEE Photovoltaic Specialists Conference, Oct. 1991, p. 147-152.

Thomas, Daniel Tomos. "Investigation of material and device properties of GaAsSbN for multi-junction solar cell applications," Jun. 2017, Thesis, Imperial College London, Department of Physics, 25 pages.

Trotta, R. et al., "Hydrogen diffusion in GaAs1-xNx," The American Physical Society Review, 2009, vol. 80, p. 195206.

Tukiainen, A. et al., "High-efficiency GaInP/GaAs/GaInNAs solar cells grown by combined MBE-MOCVD technique," Progress in Photovoltaics, Research and Applications, May 2016, vol. 24, p. 914-919.

Tukiainen, A., et al., "Improving the current output of GaInNAs solar cells using distributed Bragg reflectors," IEEE 43rd Photovoltaic Specialists Conference, Jun. 2016, 4 pages.

Unlu, M.S., "Resonant cavity enhanced photonic devices," Journal of Applied Physics Reviews, American Institute of Physics, Jul. 1995, vol. 76, p. 607-632.

Volz et al., Optimization Of Annealing Conditions of (GaIn)(NAs) For Solar Cell Applications, pp. 2222-2228, Journal of Crystal Growth 310 (2008).

Volz et al., MOVPE growth of dilute nitride III/V semiconductors using all liquid metalorganic precursors, Journal of Crystal Growth 311 (2009), pp. 2418-2526.

Wicaksono et al., "Effect of growth temperature on defect states of GaAsSbN intrinsic layer in GaAs/GaAsSbN/GaAs photodiode for 1.3 um application," Journal of Applied Physics, 2007, vol. 102, p. 044505.

Wiemer et al., "43.5% Efficient Lattice Matched Solar Cells" Proc. SPIE 810804, High and Low Concentrator Systems for Solar Electric Applications VI (Sep. 19, 2011).

Wistey et al., "Monolithic, GaInNAsSb VCSELs at 1 46um on GaAs by MBE," Electronics Letters, Dec. 2003, vol. 39, No. 25, 2 pages.

Wistey et al., Nitrogen Plasma Optimization For High-Quality Dilute Nitrides, pp. 229-233, Journal of Crystal Growth, available online on Feb. 1, 2005 at http://www.sciencedirect.com.

Wilkins, M., "Multi-junction solar cells and photovoltaic power converters: high-efficiency designs and effects of luminescent coupling," Ph.D. Dissertation, University of Ottawa, Jun. 2017, 152 pages.

Wu et al., Band Anticrossing In Highly Mismatched III-V Semiconductor Alloys, pp. 860-869, Semiconductor Science and Technology 17 (2002).

Xin et al., "Effects of hydrogen on doping of GaInNAs grown by gas-source molecular beam epitaxy," Journal of Vacuum Science and Technology, 2000, vol. 18, p. 1476-1479.

Yamaguchi et al., "Multi-junction III-V solar cells: current status and future potential", in: Solar Energy, vol. 79, issue 1, Jul. 2005.

Yoon, Soon F., et al., "Recent Progress in Dilute Nitride-Antimonide Materials for Photonic and Electronic Applications", ECS Transactions, 2009, XP055524397, pp. 5-29.

Yu et al., Mutual Passivation of Group IV Donors and Nitrogen in Diluted GaNxAs1-x Alloys, pp. 2844-2846, Applied Physics Letters, vol. 83, No. 14 (Oct. 6, 2003).

Yuen, "Growth and Characterization of Dilute Nitride Antimonides for Long-Wavelength Optoelectronics," a dissertation submitted to the department of materials science and engineering and the committee on graduate studies of Stanford University in partial fulfillment of the requirements for the degree of doctor of philosophy, Mar. 2006, 203 pages.

E. Wesoff, "Update: Solar Junction breaking CPV efficiency records, raising $30M", Greentech Media, Apr. 15, 2011, 4 pages.

E. Wesoff, "CPV Roundup: SolFocus funding, 5MW order for Solar Junction, GreenVolts, Amonix", Greentech Media, May 22, 2012, 3 pages.

E. Wesoff, "Record 44 percent CPV efficiency from startup Solar Junction", Greentech Media, Oct. 15, 2012, 3 pages.

Weyers et al., "Red shift of photoluminescence and absorption in dilute GaAsN alloy layers", Japan Journal of Applied Physics, vol. 31, Issue 7A, 1992, p. L853-L855.

International Search Report and Written Opinion PCT/US2008/008495 dated Apr. 6, 2009, 5 pages.

International Preliminary Report on Patentability PCT/US2008/008495 dated Jan. 12, 2010, 5 pages.

International Search Report and Written Opinion corresponding to the PCT application No. PCT/US10/39534, dated Sep. 8, 2010, 8 pages.

International Search Report and Written Opinion corresponding to the PCT application No. PCT/US10/56800, dated Jan. 26, 2011, 8 pages.

International Search Report and Written Opinion corresponding to the PCT application No. PCT/US2010/061635, dated Mar. 1, 2011, 7 pages.

International Search Report and Written Opinion corresponding to the PCT application No. PCT/US11/36486, dated Aug. 25, 2011, 12 pages.

International Preliminary Report on Patentability for PCT Application No. PCT/US2010/056800, dated May 31, 2012, 6 pages.

International Search Report and Written Opinion corresponding to PCT Application No. PCT/US2015/014650, dated May 20, 2015, 13 pages.

International Preliminary Report on Patentability for Application No. PCT/US2015/014650, dated Aug. 9, 2016, 21 pages.

International Search Report and Written Opinion for PCT Application No. PCT/US2013/033567, dated Mar. 4, 2014, 12 pages.

International Search Report and Written Opinion for PCT Application No. PCT/US2016/038567, dated Jun. 21, 2016, 15 pages.

International Search Report and Written Opinion for PCT Application No. PCT/US2018/039544, dated Sep. 10, 2018, 15 pages.

International Search Report and Written Opinion for PCT Application No. PCT/US2018/052873, dated Nov. 22, 2018, 12 pages.

International Search Report and Written Opinion for PCT Application No. PCT/US2019/021598, dated Jun. 14, 2019, 13 pages.

Written Opinion for Singapore Application No. 11201606353T, dated Aug. 16, 2017, 6 pages.

Non-Final Office Action for U.S. Appl. No. 14/614,601, dated Jan. 23, 2017, 11 pages.

Non-Final Office Action dated Jun. 10, 2010 for U.S. Appl. No. 12/217,818, 15 pages.

Final Office Action dated Jan. 1, 2011 for U.S. Appl. No. 12/217,818, 15 pages.

Non-Final Office Action dated Feb. 13, 2013 for U.S. Appl. No. 12/819,534, 8 pages.

Final Office Action dated Sep. 9, 2013 for U.S. Appl. No. 13/819,534, 13 pages.

(56) References Cited

OTHER PUBLICATIONS

Non-Final Office Action for U.S. Appl. No. 12/819,534, dated Sep. 16, 2015, 10 pages.
Non-Final Office Action dated Oct. 5, 2012 for U.S. Appl. No. 12/944,439, 15 pages.
Final Office Action dated May 29, 2013 for U.S. Appl. No. 12/944,439, 17 pages.
Non-Final Office Action for U.S. Appl. No. 12/944,439, dated Aug. 13, 2014, 11 pages.
Non-Final Office Action dated Oct. 24, 2012 for U.S. Appl. No. 12/749,076, 17 pages.
Non-Final Office Action dated May 24, 2013 for U.S. Appl. No. 13/739,989, 7 pages.
Non-Final Office Action dated Dec. 14, 2012 for U.S. Appl. No. 13/618,496, 16 pages.
Final Office Action dated Feb. 6, 2013 for U.S. Appl. No. 13/618,496, 8 pages.
Notice of Allowance dated Mar. 22, 2013 for U.S. Appl. No. 13/618,496, 8 pages.
Amendment, Affidavits under 37 C.F.R. §132, and Information Disclosure Statement filed Nov. 2013 for U.S. Appl. No. 13/739,989, 51 pages.
Final Office Action dated Feb. 26, 2014, for U.S. Appl. No. 13/739,989, 16 pages.
Declaration Under 37 C.F.R. § 1.132 of Homan Yuen filed for U.S. Appl. No. 13/739,989 on Nov. 15, 2013, pp. 1-10.
Declaration Under 37 C.F.R. § 1.132 of Jerry Olson filed for U.S. Appl. No. 13/739,989 on Nov. 15, 2013, pp. 1-5.
Declaration Under 37 C.F.R. § 1.132 of Minjoo Lee filed for U.S. Appl. No. 13/739,989 on Nov. 15, 2013, pp. 1-6.
Notice of Allowance for U.S. Appl. No. 14/512,224, dated Jan. 30, 2015, 8 pages.
Notice of Allowance for U.S. Appl. No. 14/678,737, dated Oct. 27, 2015, 18 pages.
Non-Final Office Action dated Feb. 15, 2013 for U.S. Appl. No. 12/914,710, 14 pages.
Final Office Action dated Sep. 6, 2013 for U.S. Appl. No. 12/914,710, 17 pages.
Notice of Allowance for U.S. Appl. No. 12/914,710, dated Sep. 25, 2015, 13 pages.
Non-Final Office Action dated Dec. 31, 2013, for U.S. Appl. No. 13/370,500, 7 pages.
Notice of Allowance for U.S. Appl. No. 13/370,500, dated Sep. 22, 2014.
Non-Final Office Action dated Nov. 8, 2012 for U.S. Appl. No. 13/104,913, 12 pages.
Notice of Allowance for U.S. Appl. No. 13/104,913, dated Feb. 21, 2014, 8 pages.
Final Office Action dated Oct. 2, 2013 for U.S. Appl. No. 13/104,913, 12 pages.
Non-Final Office Action dated Apr. 5, 2013 for U.S. Appl. No. 13/708,763, 23 pages.
Non-Final Office Action dated Apr. 25, 2013 for U.S. Appl. No. 13/708,791, 16 pages.
Non-Final Office Action for U.S. Appl. No. 13/678,389, dated Feb. 20, 2014, 13 pages.
Final Office Action for U.S. Appl. No. 13/678,389, dated Oct. 10, 2014, 15 pages.
Notice of Allowance for U.S. Appl. No. 13/708,763, dated Feb. 20, 2014, 9 pages.
Final Office Action dated Oct. 1, 2013 for U.S. Appl. No. 13/708,791, 15 pages.
Notice of Allowance for U.S. Appl. No. 13/708,791, dated Oct. 31, 2014.
Non-Final Office Action dated Mar. 21, 2014, for U.S. Appl. No. 13/442,146, 6 pages.
Non-Final Office Action for U.S. Appl. No. 16/051,109, dated Sep. 25, 2018, 11 pages.
Search Report for Singapore Application No. 11201606353T, dated Jun. 22, 2018, 7 pages.
Non-Final Office Action for U.S. Appl. No. 16/018,917, dated Oct. 16, 2018, 12 pages.
Final Office Action for U.S. Appl. No. 16/018,917, dated Mar. 22, 2019, 21 pages.
Aho et al., "Temperature Coefficients for GaInP/GaAs/GaInNAsSb Solar Cells," 11th International Conference on Concentrator Photovoltaic Systems, AIP Conference Proceedings, Sep. 2015, vol. 1679, p. 050001-1-5.
European Search Report for Application No. 20191506.03, dated Oct. 23, 2020, 13 pages.
Final Office Action dated Nov. 4, 2020, for U.S. Appl. No. 16/103,204, filed Aug. 14, 2018, eighteen pages.
Kirk, Alexander P: "Advancing solar cells to the limit with energy cascading", 2013 IEEE 39th Photovoltaic Specialists Conference (PVSC), IEEE, Jun. 16, 2013 (Jun. 16, 2013), pp. 782-787, XP032568500, DOI: 10.1109/PVSC.2013.6744265, [retrieved on Feb. 18, 2014]* the whole document*.
Non-Final Office Action dated Jan. 21, 2021, for U.S. Appl. No. 16/132,059, filed Sep. 14, 2018, twenty nine pages.
Non-Final Office Action dated Mar. 8, 2021, for U.S. Appl. No. 16/103,204, filed Aug. 14, 2018, eighteen pages.
Chinese Office Action dated Apr. 27, 2021, for CN Application No. 201810666885.7, with English translation, 14 pages.
Non-Final Office Action dated Jun. 1, 2021, for U.S. Appl. No. 16/431,521, filed Jun. 4, 2019, ten pages.
Non-Final Office Action dated Jun. 8, 2021, for U.S. Appl. No. 16/812,668, filed Mar. 9, 2020, twelve pages.
Final Office Action dated Jul. 26, 2021, for U.S. Appl. No. 16/103,204, filed Aug. 14, 2018, 21 pages.
European Office Action dated Oct. 22, 2021, for European Application No. 18786911.0, nine pages.
Chinese Office Action dated Oct. 21, 2021, for CN Application No. 201810666885.7, with English translation, 15 pages.

\* cited by examiner

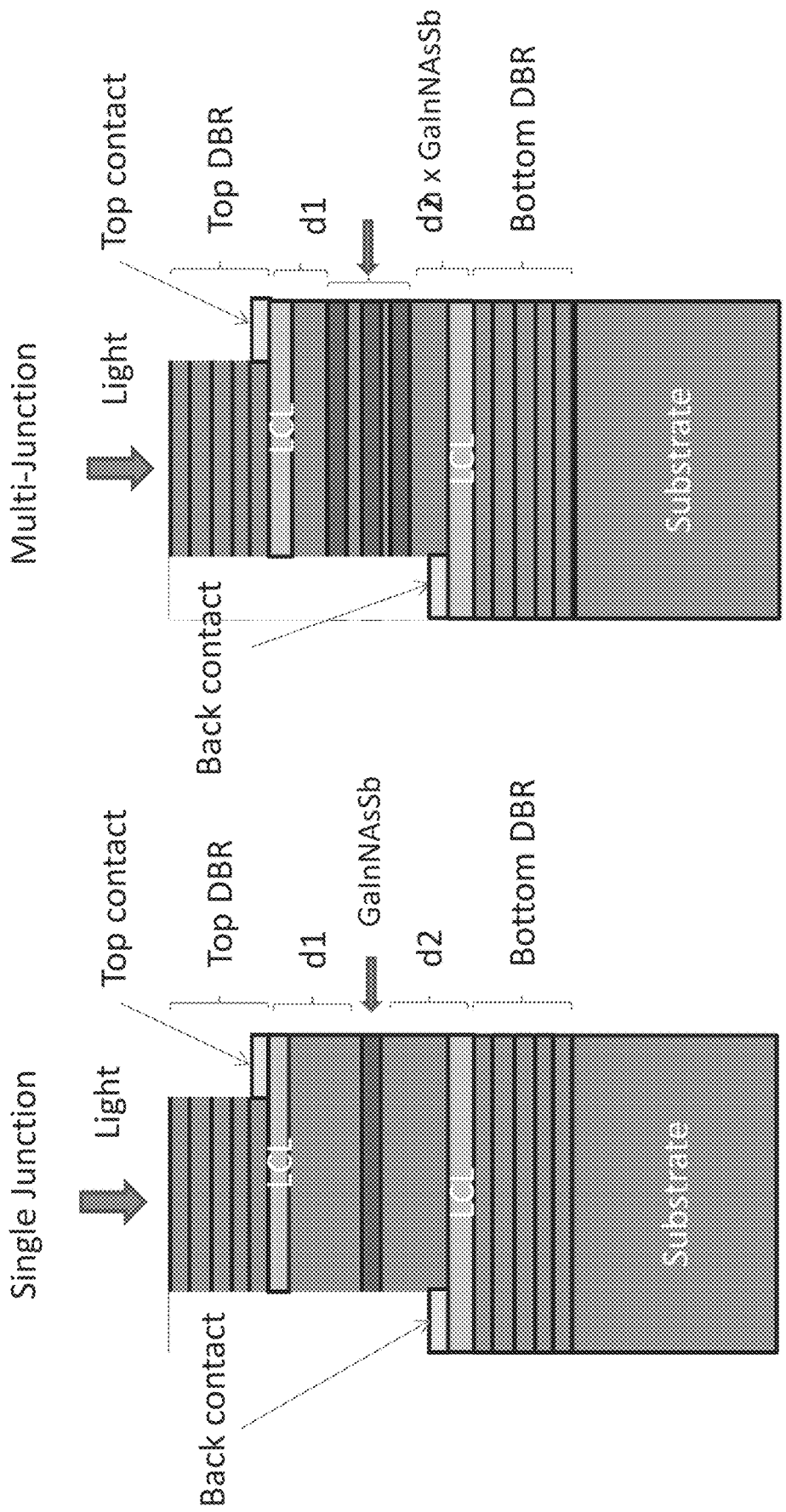

MONOLITHIC MULTIJUNCTION POWER CONVERTER

This application is a Continuation of U.S. application Ser. No. 16/051,109, filed on Jul. 31, 2018, which is a Continuation of U.S. application Ser. No. 14/614,601, filed on Feb. 5, 2015, which claims the benefit under 35 U.S.C. § 119(e) of U.S. Provisional Application No. 61/936,222, filed on Feb. 5, 2014, which is incorporated by reference in its entirety.

FIELD

The disclosure relates to the field of power conversion.

BACKGROUND

Power converters may be used in a number of applications to charge electronic devices, such as cell phones, audio systems, home theaters, or any other electronic devices, from a power source. It is well known in the field that Ohmic losses are inversely related to an increase in voltage and directly related to an increase in current. It is advantageous, then, to increase the fill factor of power converter devices by increasing the voltage of the devices.

Prior art power converters in the field include monolithically series-connected single layer converters made of semiconductor wafers, such as GaAs. Such power converters may be connected in series by wiring or sectored off by manufacturing the converter on a semi-insulating substrate using insulating trenches to provide electrical insulation between each sectored converter. The energy source for such power converters is a monochromatic light, such as a laser operating at a particular wavelength or energy. In this particular application, the monochromatic light is between 1 micron to 1.55 microns, in the infrared region of the spectrum. Closer to 1 micron is less advantageous for home use due to the potential dangers of the light source to the human eye, so the focus of the embodiments disclosed herein is on light sources between 1.3-1.55 microns, and in certain embodiments, around 1.3 microns. However, those skilled in the field may easily modify the invention disclosed herein to convert light of a number of wavelengths.

SUMMARY

The invention comprises a compact, monolithic multi-junction power converter, with two or more epitaxial layers of the same material stacked on top of one another with tunnel junctions in between each epitaxial layer. Because the epitaxial layers are stacked on top of one another, each epitaxial layer is thinned to collect a maximum amount of light and converts power in series to increase the fill factor by increasing voltage of the overall device and decreasing Ohmic losses (which increase with current increase). Given the stacked epitaxial layers, light which is not absorbed in one layer is absorbed in the next layer directly beneath the first layer and so on. The power converter may reach an overall efficiency of approximately 50%. There are minimal current losses in these devices given that complex circuitry is avoided using the vertical stacking of the epitaxial layers, compared to the prior art, which requires interconnections between the semiconductor light absorbing sectors.

In a first aspect, power converters are provided, comprising one or more GaInNAsSb junctions; a first semiconductor layer overlying the one or more GaInNAsSb junctions; and a second semiconductor layer underlying the one or more GaInNAsSb junctions; wherein a thickness of the one or more GaInNAsSb junctions, the first semiconductor layer and the second semiconductor layer are selected to provide a resonant cavity at an irradiated wavelength.

BRIEF DESCRIPTION OF THE DRAWINGS

The drawings described herein are for illustration purposes only. The drawings are not intended to limit the scope of the present disclosure.

FIGS. 8A and 8B show single junction and triple junction resonant power converters, respectively, with two DBRs and etched back contacts to lateral conducting layers (LCL), according to certain embodiments.

Reference is now made in detail to embodiments of the present disclosure. While certain embodiments of the present disclosure are described, it will be understood that it is not intended to limit the embodiments of the present disclosure to the disclosed embodiments. To the contrary, reference to embodiments of the present disclosure is intended to cover alternatives, modifications, and equivalents as may be included within the spirit and scope of the embodiments of the present disclosure as defined by the appended claims.

DETAILED DESCRIPTION

Figure 1:
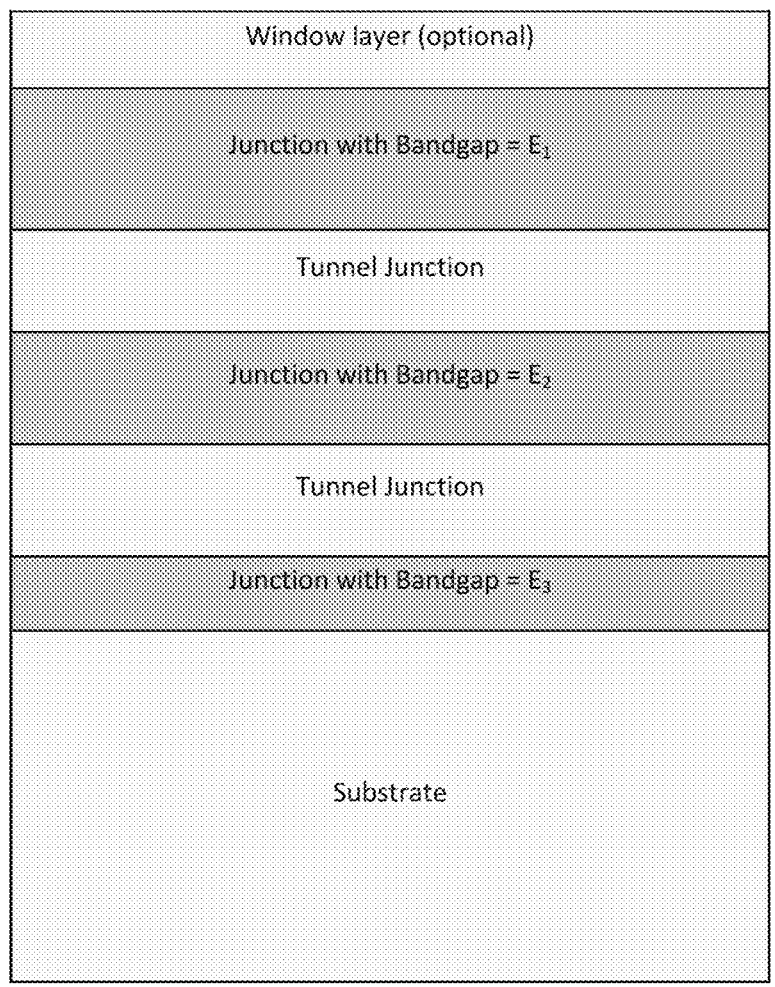
FIG. 1 shows an embodiment of a monolithic multijunction power converter in which $E_1$, $E_2$, and $E_3$ represent semiconductor materials having the same bandgap.

In certain embodiments provided by the present disclosure, two or more epitaxial layers of the same semiconductor material grown on a substrate, such as GaInNAs, GaInNAsSb, GaAs, Ge, GaSb, InP or other substrate known in the art, are stacked on top of one another with tunnel junctions in between each epitaxial layer. FIG. 1 shows an embodiment of a monolithic multijunction power converter in which $E_1$, $E_2$, and $E_3$ represent semiconductor materials having the same bandgap. Each epitaxial layer has the same bandgap, which is roughly matched to the energy of the monochromatic light source to minimize minority carrier and thermal losses. In certain embodiments, the light source reaches the uppermost epitaxial layer furthest from the substrate. In some embodiments, the epitaxial layer material may be a dilute-nitride material, such as GaInNAs or GaInNAsSb, or other dilute nitride known in the art. In some embodiments, the monochromatic light source is between 1 micron and up to 1.55 microns, and in certain embodiments, the light source is approximately 1.3 microns. While some current may be lost through light absorption by the tunnel junction(s), light that is not collected in the first epitaxial layer is collected in the second epitaxial layer, and so on. The overall efficiency of such a device may reach at least 50% power efficiency, such as from 50% to 60% or from 50% to 70%. In certain embodiments, the power conversion efficiency of a single junction power converter is at least 20% such as from 20% to 40%. In certain embodiments, the power conversion efficiency of a single junction power converter is at least 30% such as from 30% to 50%. In certain embodiments, three junction devices provided by the present disclosure exhibit a conversion efficiency from about 23% to about 25% over an input power from about 0.6 W to about 6 W when irradiated with 1.32 micron radiation.

In certain embodiments, three or more epitaxial layers of the same semiconductor material grown on a substrate such as GaInNAs, GaInNAsSb, GaAs, Ge, GaSb, InP or other substrate known in the art, are stacked on top of one another with tunnel junctions in between each epitaxial layer. Increasing the number of junctions in a power converter device can result in increased fill factor, increased open circuit voltage (Voc) and decreased short circuit current (Jsc). Each epitaxial layer has the same bandgap, which is roughly matched to the energy of the monochromatic light source to minimize minority carrier and thermal losses. In certain embodiments, the light source reaches the bottom most epitaxial layer closet to the substrate first. The substrate has a bandgap that is higher than the bandgap of the epitaxial layers. Given that the substrate has a higher bandgap than that of the epitaxial layers, the light source passes through the substrate and the light is absorbed by the epitaxial layers. An example of this employs GaInNAs epitaxial layers (bandgap of 0.95 eV) and a GaAs substrate (bandgap 1.42 eV). The light source in this example will not be absorbed by the GaAs substrate and will be absorbed by the GaInNAs active region. A heat sink can be coupled to the top of the uppermost epitaxial layer, and can serve to cool the device and prevent defects caused by overheating. In some embodiments, the epitaxial layer material may be a dilute-nitride material, such as GaInNAs or GaInNAsSb, or other dilute nitride known in the art. In some embodiments, the monochromatic light source has a wavelength between 1 micron and up to 1.55 microns, in certain embodiments, from 1 micron to 1.4 micron, and in certain embodiments the light source is approximately 1.3 microns. While some current may be lost through light absorption by the tunnel junction(s), light that is not collected in the first epitaxial layer can be collected in the second epitaxial layer, and so on. The overall efficiency of such a device may reach at least 50% power efficiency.

In certain embodiments, the light absorbing layer(s) comprise GaInNAsSb. In certain of the embodiments, a GaInNAsSb junction comprises $Ga_{1-x}In_xN_yAs_{1-y-z}Sb_z$, in which values for x, y, and z are $0 \leq x \leq 0.24$, $0.01 \leq y \leq 0.07$ and $0.001 \leq z \leq 0.20$; in certain embodiments, $0.02 \leq x \leq 0.24$, $0.01 \leq y \leq 0.07$ and $0.001 \leq z \leq 0.03$; in certain embodiments, $0.02 \leq x \leq 0.18$, $0.01 \leq y \leq 0.04$ and $0.001 \leq z \leq 0.03$; in certain embodiments, $0.08 \leq x \leq 0.18$, $0.025 \leq y \leq 0.04$ and $0.001 \leq z \leq 0.03$; and in certain embodiments, $0.06 \leq x \leq 0.20$, $0.02 \leq y \leq 0.05$ and $0.005 \leq z \leq 0.02$.

In certain of the embodiments, a GaInNAsSb junction comprises $Ga_{1-x}In_xN_yAs_{1-y-z}Sb_z$, in which values for x, y, and z are $0 \leq x \leq 0.18$, $0.001 \leq y \leq 0.05$ and $0.001 \leq z \leq 0.15$, and in certain embodiments, $0 \leq x \leq 0.18$, $0.001 \leq y \leq 0.05$ and $0.001 \leq z \leq 0.03$; in certain embodiments, $0.02 \leq x \leq 0.18$, $0.005 \leq y \leq 0.04$ and $0.001 \leq z \leq 0.03$; in certain embodiments, $0.04 \leq x \leq 0.18$, $0.01 \leq y \leq 0.04$ and $0.001 \leq z \leq 0.03$; in certain embodiments, $0.06 \leq x \leq 0.18$, $0.015 \leq y \leq 0.04$ and $0.001 \leq z \leq 0.03$; and in certain embodiments, $0.08 \leq x \leq 0.18$, $0.025 \leq y \leq 0.04$ and $0.001 \leq z \leq 0.03$.

In certain embodiments, a GaInNAsSb junction is characterized by a bandgap of 0.92 eV and comprises $Ga_{1-x}In_xN_yAs_{1-y-z}Sb_z$, in which values for x, y, and z are: x is 0.175, y is 0.04, and $0.012 \leq z \leq 0.019$.

In certain embodiments, a GaInNAsSb junction is characterized by a bandgap of 0.90 eV and comprises $Ga_{1-x}In_xN_yAs_{1-y-z}Sb_z$, in which values for x, y, and z are: x is 0.18, y is 0.045, and $0.012 \leq z \leq 0.019$.

In certain embodiments, a GaInNAsSb junction is comprises $Ga_{1-x}In_xN_yAs_{1-y-z}Sb_z$, in which values for x, y, and z are: $0.13 \leq x \leq 0.19$, $0.03 \leq y \leq 0.048$, and $0.007 \leq z \leq 0.02$.

In certain embodiments, a GaInNAsSb junction comprises $Ga_{1-x}In_xN_yAs_{1-y-z}Sb_z$, in which values for x, y, and z are selected to have a band gap that matches or closely matches the energy of the radiation used to deliver power to the device. In certain embodiments, the GaInNAsSb junction is substantially lattice matched to a GaAs substrate. It is to be noted that the general understanding of "substantially lattice matched" is that the in-plane lattice constants of the materials in their fully relaxed states differ by less than 0.6% when the materials are present in thicknesses greater than 100 nm. Further, subcells that are substantially lattice matched to each other as used herein means that all materials in the subcells that are present in thicknesses greater than 100 nm have in-plane lattice constants in their fully relaxed states that differ by less than 0.6%.

In certain embodiments, each of the epitaxial layers in the power converter is lattice matched to a GaAs substrate.

In certain embodiments, the use of layering materials of different refractive indices can produce distributed Bragg reflectors (DBR) within the structure and is used to increase the efficiency of the power converter. One such example uses a dilute nitride material, which in certain embodiments is a GaInNAsSb material, as the absorbing material in the epitaxial stack of the structure. A cavity can be grown using a material such as GaAs/AlGaAs as a DBR below the dilute nitride layer and above the substrate, and another DBR grown above the dilute nitride layer, that can be made of semiconductors or a number of oxides.

Figure 2B:
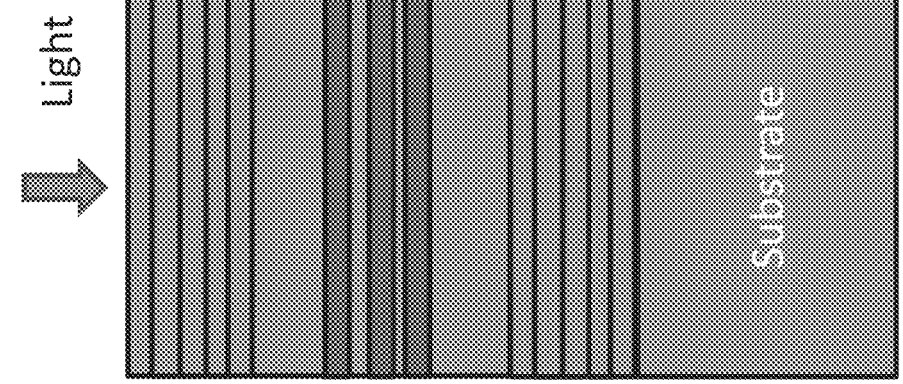
FIGS. 2A and 2B show single junction and triple junction resonant power converters, respectively, with dual distributed Bragg reflectors (DBR), according to certain embodiments.
Figure 2A:
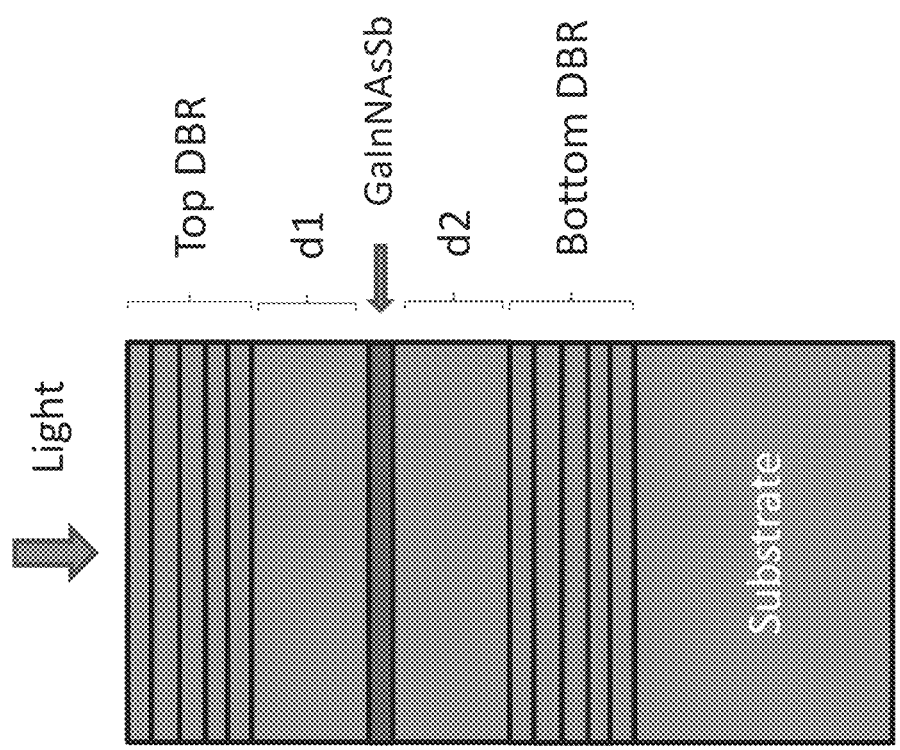

In certain embodiments, where the substrate has a higher bandgap than the absorbing material, a back-side metal can be used as structured mirror, allowing unabsorbed light to be reflected from the back metal to be reabsorbed in the epitaxial layers above. Examples of resonant cavity power converters using the double pass configuration are shown in FIGS. 2A and 2B. FIG. 2A shows a single junction resonant cavity with a top DBR and a bottom DBR. A single GaInNAsSb junction is disposed between the two DBRs and separated from the DBRs by semiconductor layers d1 and d2. Semiconductor layers may be formed from a material that does not appreciably absorb the incident radiation and that can be lattice matched to GaAs and the absorbing layer, and in certain embodiments can be GaAs. The thickness of d1, d2 and a GaInNAsSb junction can be selected to provide a standing wave at the wavelength of the incident radiation. FIG. 2B shows a similar configuration as shown in FIG. 2A but includes multiple GaInNAsSb junctions with each of the junctions separated by a tunnel junction. The thickness of the GaInNAsSb junction can be from about 100 nm to about 1 micron. In certain embodiments, the substrate is a semi-insulating or n-doped GaAs substrate with a back-metal as the bottom-most layer of the structure.

For use with 1 micron to 1.55 micron radiation, the mirror layer can be, for example, gold or gold/nickel alloys.

Figures 3A, 3B:
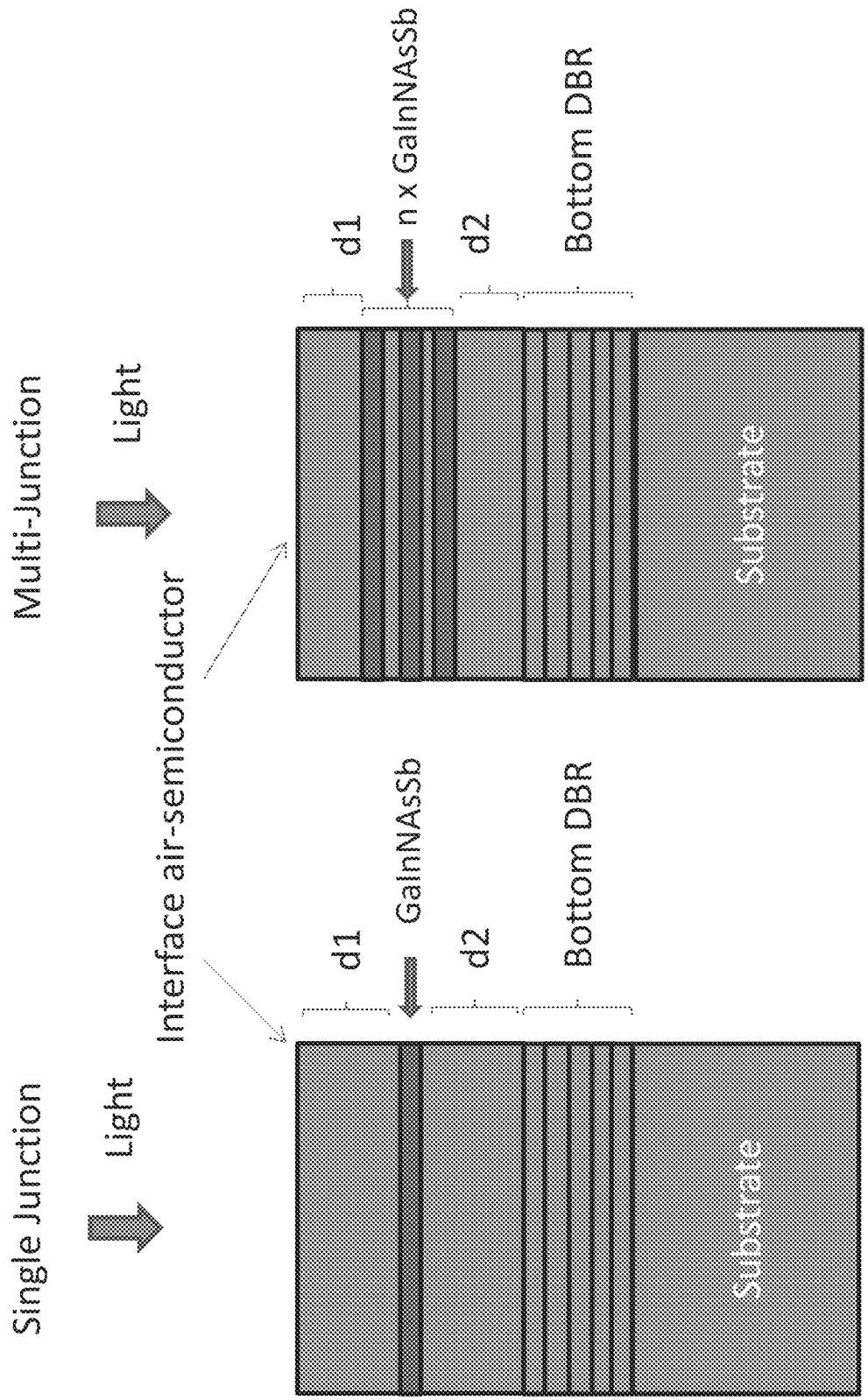
FIGS. 3A and 3B show single junction and triple junction resonant power converters, respectively, with single DBRs, according to certain embodiments.

In certain embodiments, the power converter structure uses one DBR instead of two. Resonant power converters employing a single DBR are shown in FIGS. 3A and 3B. FIG. 3A shows a single GaInNAsSb junction disposed between two semiconductor layers d1 and d2. These layers overly a bottom DBR, which overlies a substrate. The upper surface of the device, such as the upper surface of layer d1 facing the incident radiation may be coated with an antireflection coating. The antireflection coating may be optimized for the wavelength of the incident radiation to reduce scattering. FIG. 3B shows a single DBR resonant cavity configuration having multiple GaInNAsSb junctions.

Figures 4A, 4B:
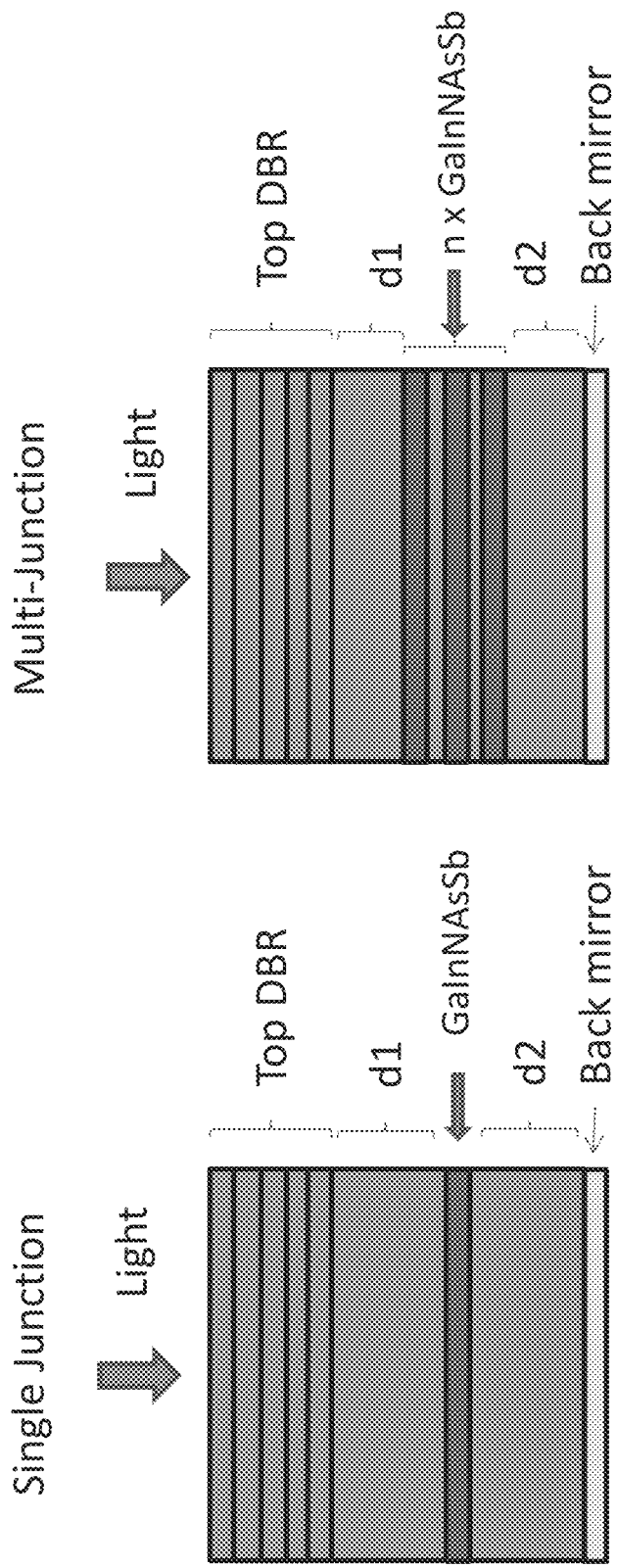
FIGS. 4A and 4B show single junction and triple junction resonant power converters, respectively, with a top DBR and a back mirror, according to certain embodiments.

In certain embodiments, the power converter structure includes one DBR and a back mirror below the substrate. Such device configurations are shown in FIGS. 4A, 4B, 5A, and 5B. FIGS. 4A and 4B show power converters having a top DBR a resonant cavity including a single GaInNAsSb junction between two semiconductor layers d1 and d2, and a back mirror beneath semiconductor layer d2. In certain embodiments, the back mirror can also serve as an electrical contact. A multi junction power converter is shown in FIG. 4B in which multiple GaInNAsSb junctions are disposed between a top DBR and a back mirror.

Figures 5A, 5B:
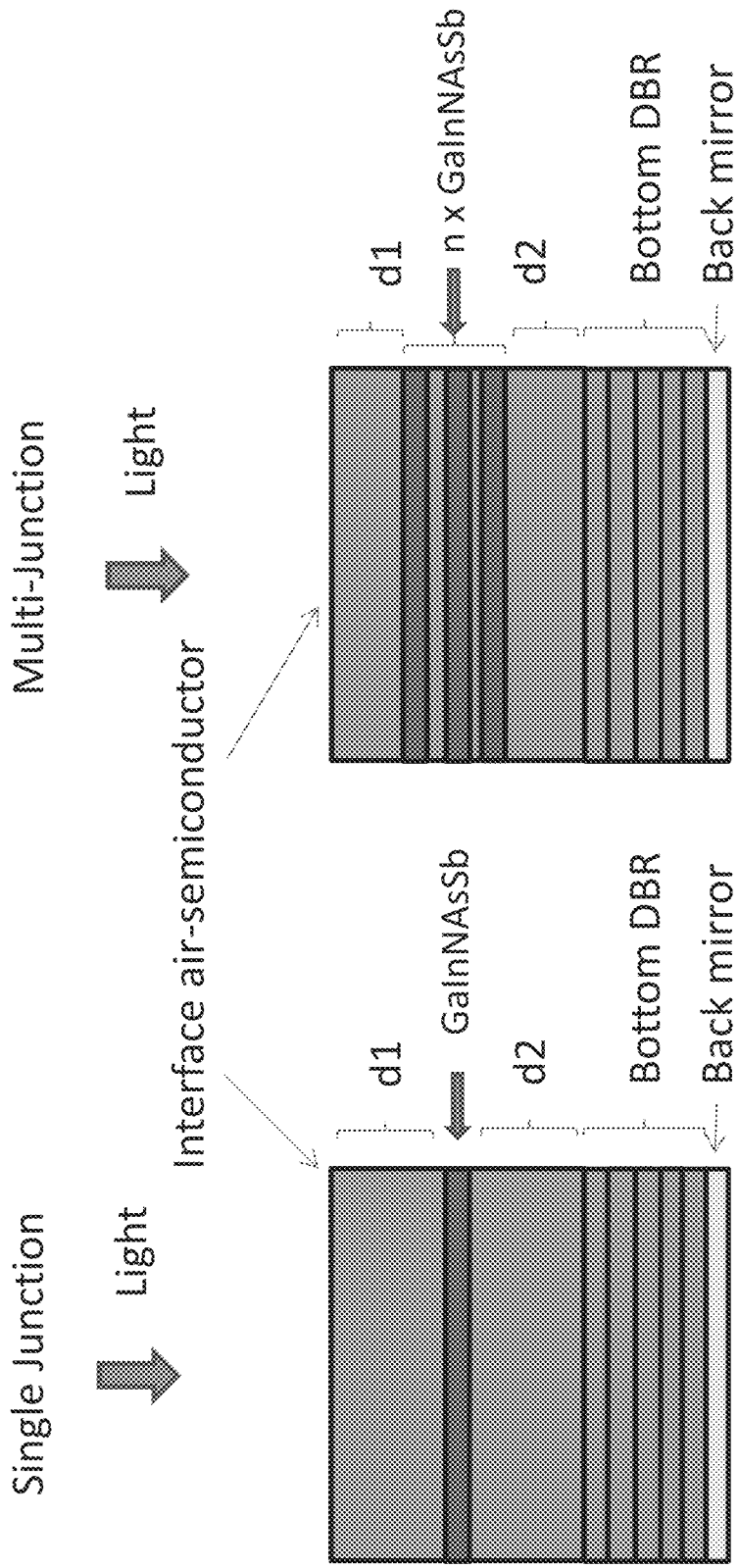
FIGS. 5A and 5B show single junction and triple junction resonant power converters, respectively, with a back mirror, according to certain embodiments.

In the power converters shown in FIGS. 5A and 5B both a DBR and a back mirror are used at the bottom of the device. In this configuration the thickness of the DBR can be reduced compared to a configuration with a bottom DBR without the back mirror. As with other devices, the upper surface of layer D1 may include an antireflection coating. In certain embodiments, the substrate is removed and a metal is used it its place as a back mirror. In such structures, the light passes through the top DBR, then through the epitaxial layers, then through the bottom DBR and finally hits the back mirror. In these embodiments, the epitaxial layer comprises GaInNAsSb as one or more absorbing layers.

In certain embodiments, the upper most layer of the structure comprises an interface air-semiconductor above the epitaxial layers, which may comprise of one or more layers of GaInNAsSb. Below the epitaxial layer is a bottom DBR which overlays a back mirror. In these embodiments, the light hits the upper most layer of the interface air-semiconductor and moves to the epitaxial layer, then the DBR and finally reflects back through the structure after being reflected by the back mirror.

Figures 6A, 6B:
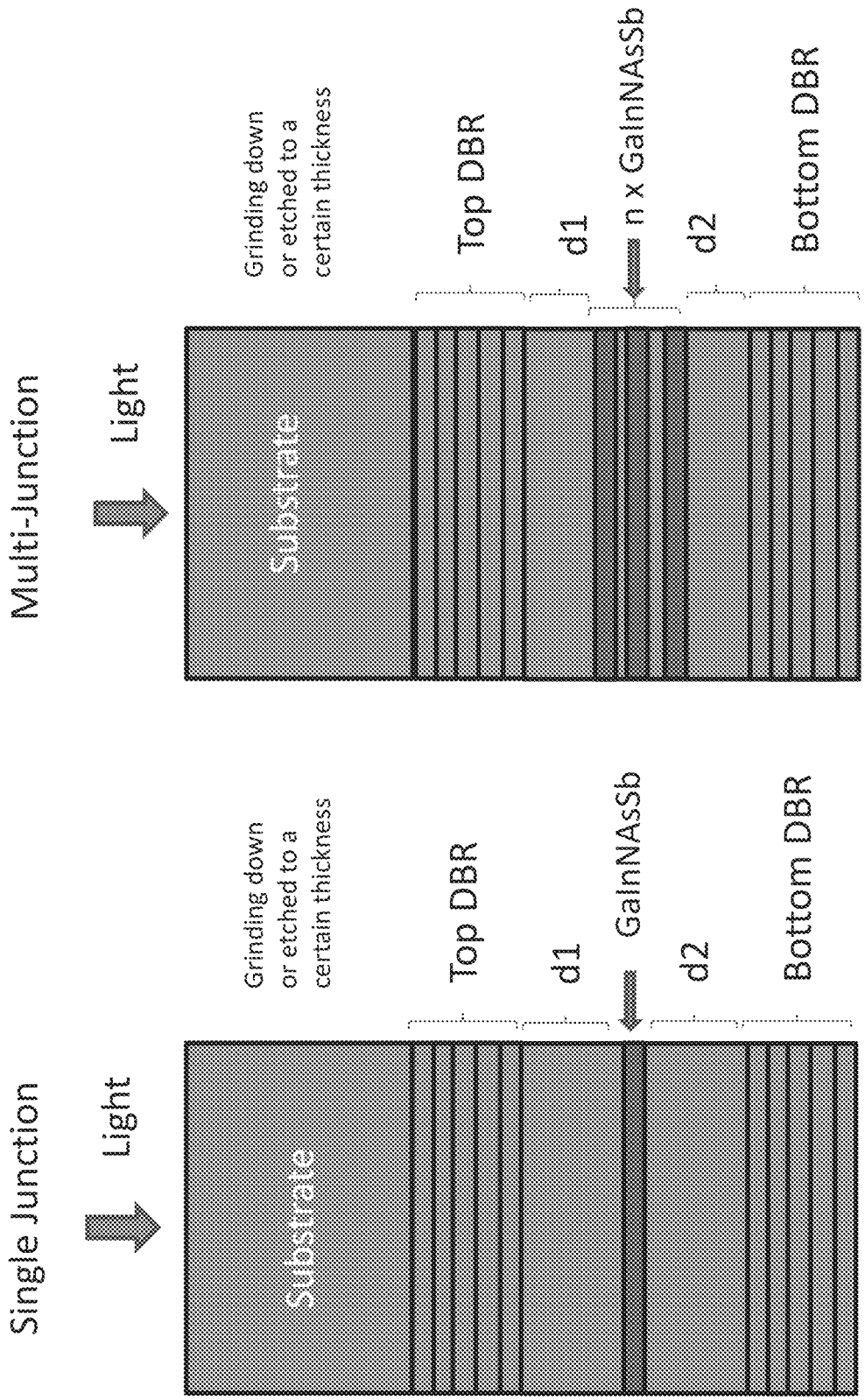
FIGS. 6A and 6B show single junction and triple junction resonant power converters, respectively, with two DBRs and a top substrate, according to certain embodiments.

Resonant cavity configurations with two DBRs and a top substrate layer are shown in FIGS. 6A and 6B. The top substrate layer is substantially transparent to the incident radiation used to generate the power. In certain embodiments, the substrate can be GaAs such as n-type GaAs and can have a thickness from about 150 microns to about 250 microns, such as from 175 microns to 225 microns. The thickness of the substrate can be thinned, for example, by grinding or etching to minimize absorption and in such embodiments can be 50 microns or less. In certain embodiments, the bottom DBR can be bonded to a heatsink. Bonding the DBR directly to the heatsink can reduce the temperature of the power converter.

Figures 7A, 7B:
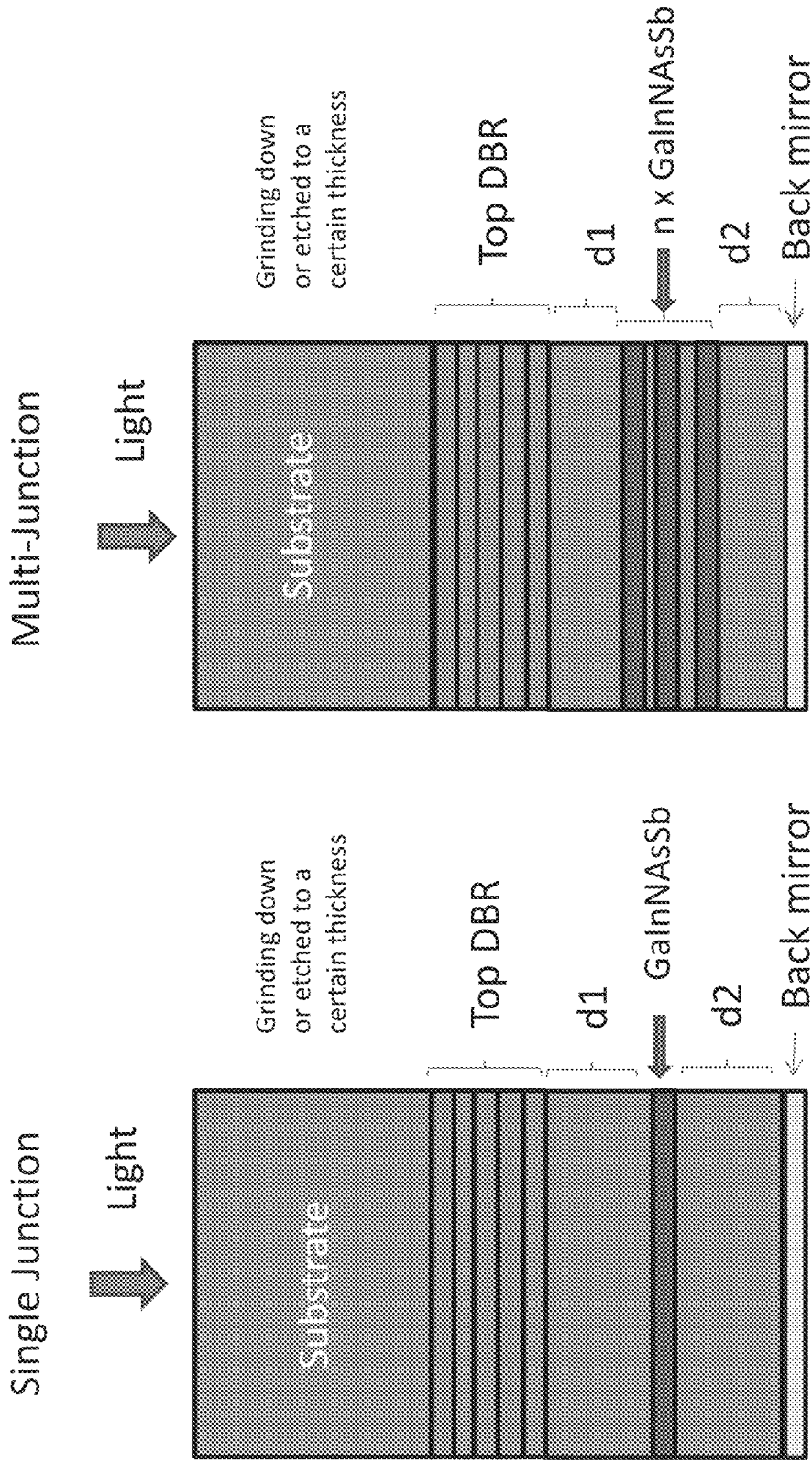
FIGS. 7A and 7B show single junction and triple junction resonant power converters, respectively, with a substrate overlying a top DBR and a back mirror, according to certain embodiments.

FIGS. 7A and 7B shown device configurations similar to those shown in FIGS. 6A and 6B but with the bottom DBR replaced with a back mirror.

In certain embodiments, the structure has intra-cavity contacts to avoid resistivity from the DBR structures. The contact is made in the cavity through lateral transport conducting layers (LCL) bypassing the DBR structures. Power converters having intra-cavity contacts are shown in FIGS. 8A and 8B. In these device structures the epitaxial layers are etched down to either an LCL overlying the bottom DBR or to an LCL overlying semiconductor layer d1. The LCLs improve carrier mobility to the electrical contacts (back contact and top contact) and can be formed, for example, from doped GaAs such as n-type GaAs. LCLs and similar etch back electrical contacts can be employed with other device structures provided by the present disclosure.

In certain embodiments, the structure can be grown inverted. In such cases, the substrate can be thinned down to a certain thickness or removed after growth using a variety of lift off techniques. The light passes through the substrate first before passing through the epitaxy layers. In such structures, the bandgap of the substrate is greater than the bandgap of the epitaxial layers.

Figure 9:
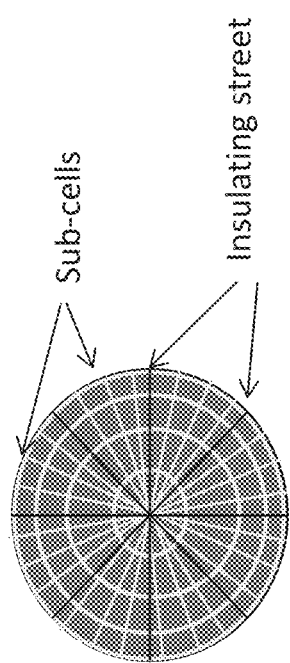
FIG. 9 shows a top view of a Pi structure having multiple power converters interconnected in series, according to certain embodiments.

Multiple photovoltaic converters comprised of a number of subcells connected in series can be constructed to increase the output voltage. The subcells can be connected in parallel for increasing output current. An example is a Pi structure as shown in FIG. 9. Infrared absorbers are typically characterized by low voltage; however, in certain application it is desirable to increase the voltage of the power converter. This can be accomplished by connecting multiple power converters in series. One such configuration, of which a top-down view is shown in FIG. 9, is referred to as a Pi structure in which multiple power converter cells are disposed in concentric rings around a central axis, where each cell is separated by an insulator and the multiple cells or subsets of the multiple cells are connected in series. Such structures can be fabricated using single junctions and provide a high density of cells. The higher voltages provide improved DC-DC converter efficiencies and lower Ohmic losses. Although later currents can produce Ohmic losses this can be offset because the increased number of sub-cells results in lower currents.

Figures 10A, 10B:
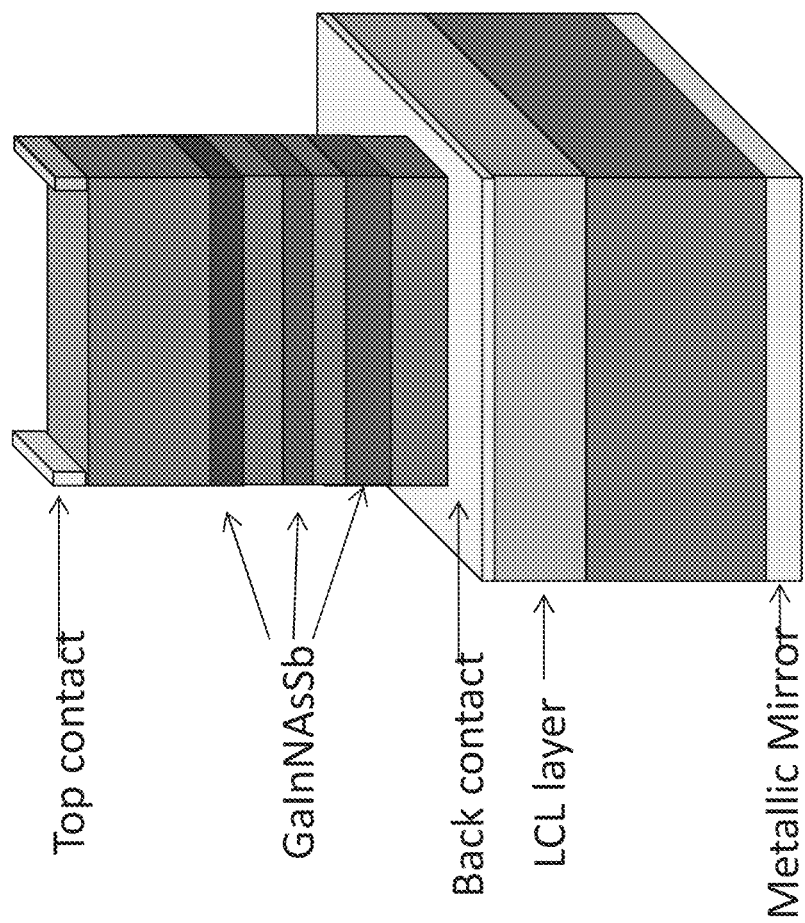
FIGS. 10A and 10B show triple-junction power converters having a double pass configuration and characterized by a single area (FIG. 10A) or four quadrant area (FIG. 10B), according to certain embodiments.
Figure 11B:
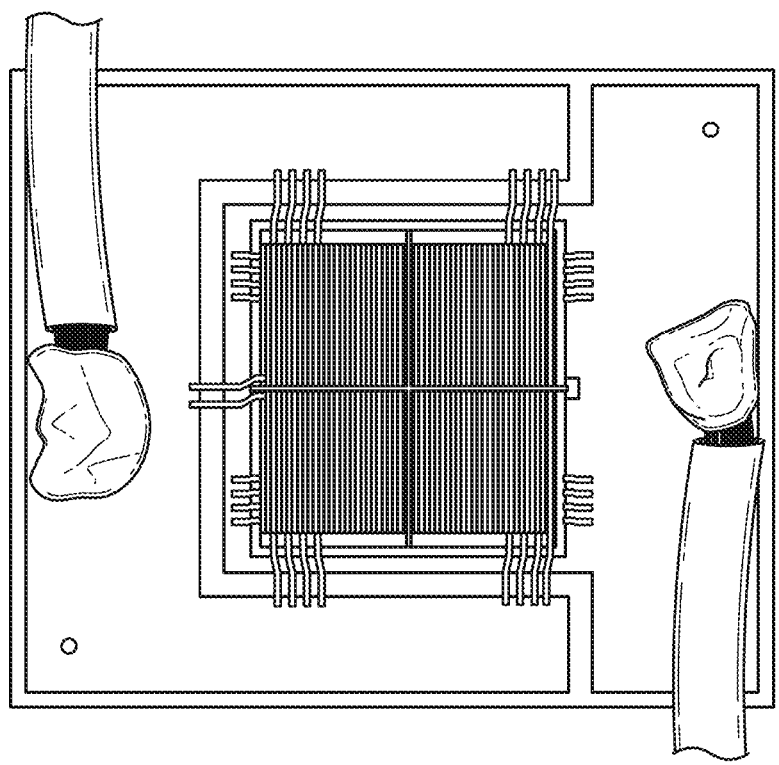
FIGS. 11A and 11B show photographs of the top view of the triple-junction power converters shown schematically in FIGS. 10A and 10B, respectively.
Figure 11A:
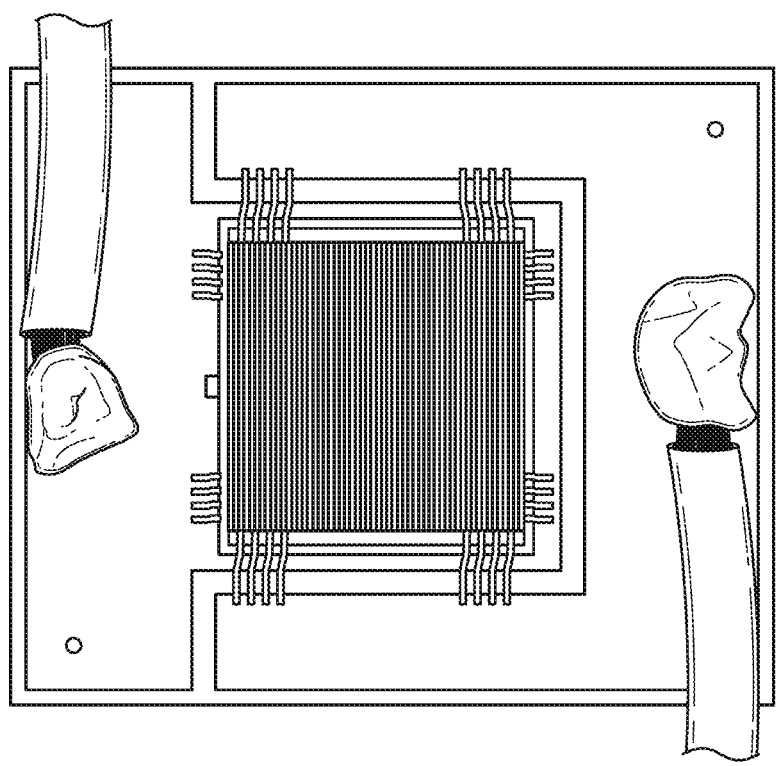

Other device structures are shown in FIGS. 10A and 10B. FIG. 10A shows single a triple junction double pass power converter. FIG. 10B shows a four quadrant triple-junction double pass power converter. The dimensions of the devices are 300 microns by 300 microns. The four converters can be interconnected in series to increase the voltage and/or decrease the current. The series interconnection can also reduce the sensitivity to spatial orientation of the incident radiation. Furthermore, for large area power converters, separating the collection area into quadrants or other subareas can reduce the Ohmic losses by bringing the electrical contacts closer to the power generating surfaces. Photographs of the single and four quadrant devices are shown in FIGS. 11A and 11B.

The power converters shown in FIGS. 10A, 10B, 11A, and 11B were fabricated using GaInNAsSb junctions. All epitaxial layers were lattice matched to a GaAs substrate. A back mirror is disposed at the bottom of the GaAs substrate. The resonant cavity of the three-junction structures was configured to support a standing wave at about 1.3 microns, such as at 1.32 microns or at 1.342 microns. The bandgap of the GaInNAsSb junctions was about 0.92 eV for devices configured for power conversion at 1.32 microns. Certain of such devices exhibited a fill factor from about 65% to about 75%, a Voc of from about 1.4 7V to about 1.5 V and a Jsc from about 0.6 A to about 1.4 A. The power conversion efficiency was from about 23% to 25% at an input power from about 0.6 W to about 6 W.

In certain embodiments, the two or more epitaxial layers of the same semiconductor material are of varying thicknesses. In particular, the epitaxial layers can decrease in thickness the further away from the light source. In certain embodiments, the thicknesses of each of the epitaxial layers are the same. In certain embodiments, the thicknesses of the epitaxial layers are varied, either increasing nor decreasing depending on the light source location.

In some embodiments, there is a window layer on top of the upper most epitaxial layer.

In certain embodiments, the thickness, or height, of the entire device may be between 1 micron and up to 10 microns. The area of the power converter can be, for example, between 100 microns×100 microns, and up to 1 cm×1 cm, or more. For example the total area is from $10^{-4}$ cm$^2$ to 1 cm$^2$. The thickness of each epitaxial layer may be between a few hundred nanometers up to a few microns.

Figure 12:
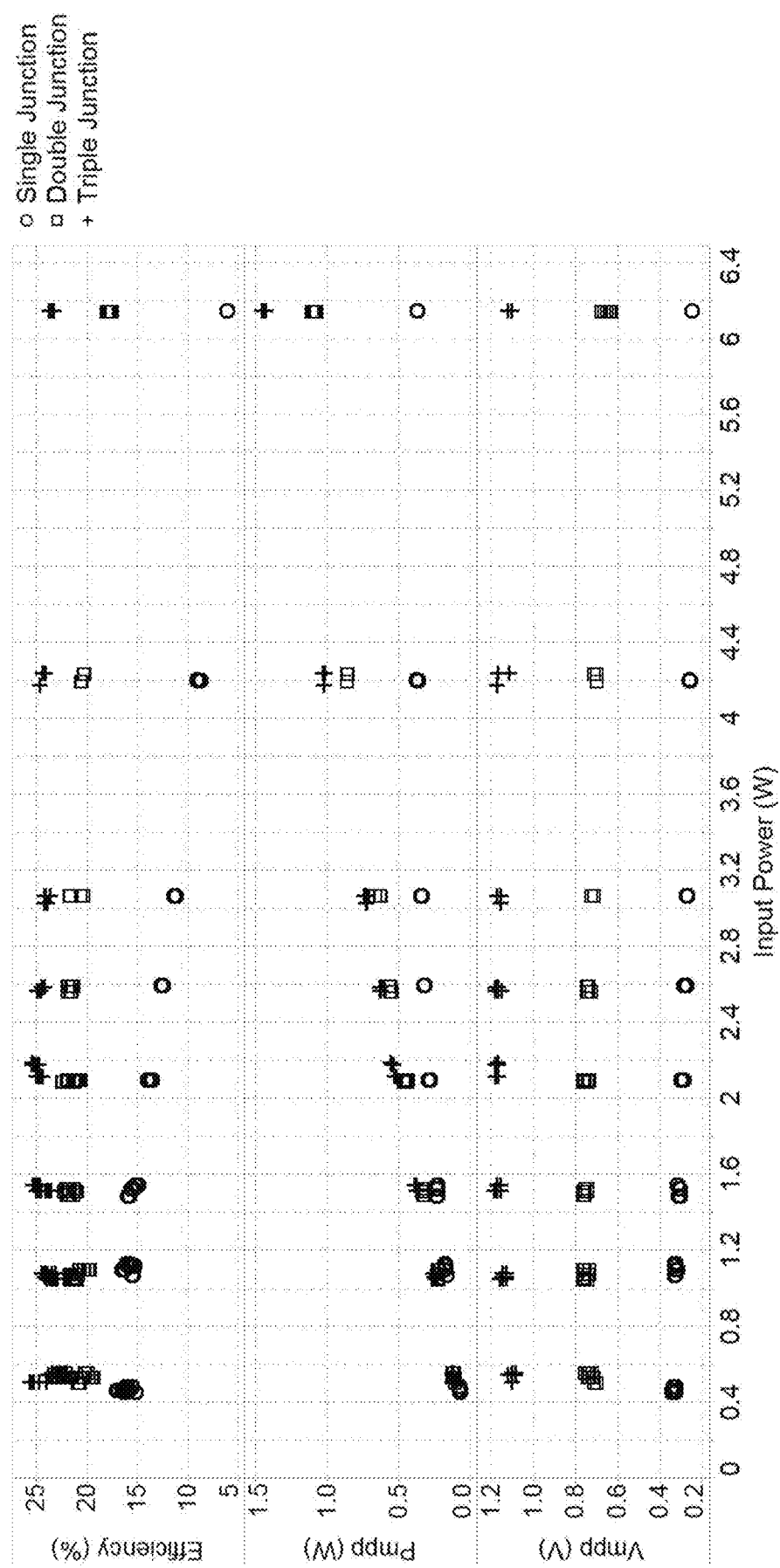
FIG. 12 shows the efficiency, power output, and voltage at maximum power point (Mpp) as a function of laser input power for single, double, and triple lattice-matched GaInNAsSb junction power converters.

FIG. 12 shows the efficiency, power output and voltage at maximum power point (Mpp) as a function of laser input power for single (open circle), double (square), and triple (plus) GaInNAsSb junction power converters.

Figure 13:
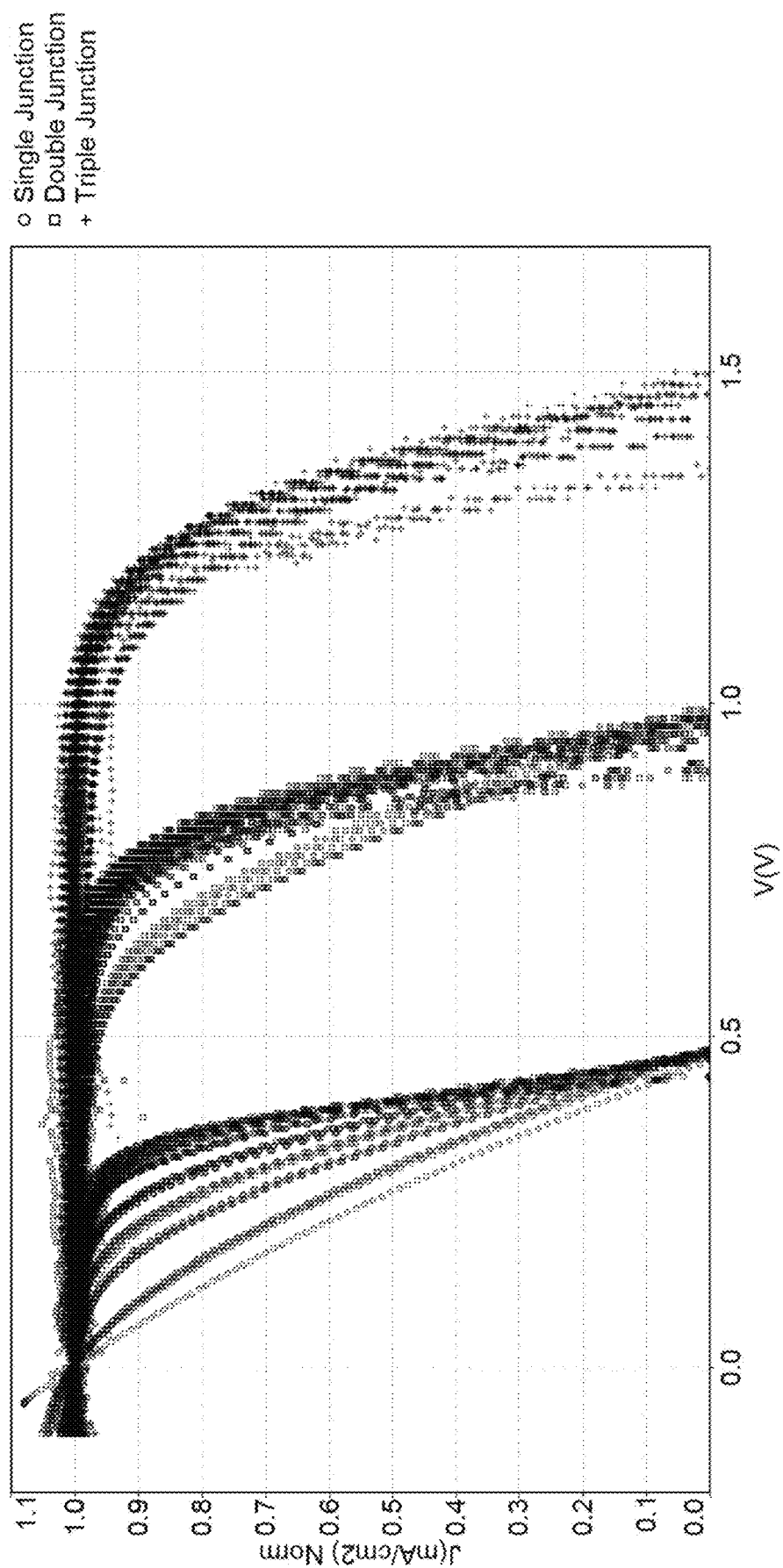
FIG. 13 shows the normalized density of current (J) as a function of voltage for several laser input power levels for single, double and triple lattice-matched GaInNAsSb junction power converters.

FIG. 13 shows the normalized current density (J) as a function of voltage for several laser input power levels for single (open circle), double (square), and triple (plus) GaInNAsSb junction power converters.

Finally, it should be noted that there are alternative ways of implementing the embodiments disclosed herein. Accordingly, the present embodiments are to be considered as illustrative and not restrictive. Furthermore, the claims are not to be limited to the details given herein, and are entitled their full scope and equivalents thereof

What is claimed is:

1. A method of making a multijunction power converter, comprising:
   growing a first semiconductor layer overlying a GaAs or Ge substrate, wherein the first semiconductor layer does not absorb at a monochromatic wavelength, wherein the monochromatic wavelength is within a range from 1.3 micron to 1.55 micron;
   growing a first GaInNAsSb junction on the first semiconductor layer, wherein the first GaInNAsSb junction has a bandgap configured to absorb at the monochromatic wavelength;
   growing a first tunnel junction on the first GaInNAsSb junction;
   growing a second GaInNAsSb junction on the first tunnel junction, wherein the second GaInNAsSb junction has the bandgap configured to absorb at the monochromatic wavelength;
   growing a second semiconductor layer overlying the second GaInNAsSb junction, wherein the second semiconductor layer does not absorb at the monochromatic wavelength;
   growing a distributed bragg reflector overlying the GaAs or Ge substrate, wherein the first semiconductor layer overlies the distributed bragg reflector, wherein the distributed bragg reflector comprises layers of GaAs and AlGaAs; and
   thinning the GaAs or Ge substrate wherein incoming radiation is first incident on the GaAs or Ge substrate before being incident on the first and second GaInNAsSb junctions.

2. The method of claim 1, further comprising, after growing the second GaInNAsSb junction:
   growing a second tunnel junction on the second GaInNAsSb junction; and
   growing a third GaInNAsSb junction on the second tunnel junction, wherein the third GaInNAsSb junction has a bandgap configured to absorb at the monochromatic wavelength;
   wherein the growing the second semiconductor layer, comprises growing the second semiconductor layer overlying the third GaInNAsSb junction.

3. The method of claim 1, wherein each of the first semiconductor layer and the second semiconductor layer comprises GaAs.

4. The method of claim 1, wherein the monochromatic wavelength is 1.32 microns.

5. The method of claim 1, wherein the multijunction power converter has a power conversion efficiency of at least 20% for an input power within a range from 0.6 W to 6 W.

6. The method of claim 1, further comprising:
   growing a second distributed bragg reflector, the second distributed bragg reflector overlying the second semiconductor layer.

7. The method of claim 6, further comprising:
   bonding the second distributed bragg reflector to a heatsink.

8. The method of claim 1, further comprising:
   growing a back mirror, the back mirror overlying the second semiconductor layer.

9. The method of claim 8, wherein growing the back mirror comprises growing gold or a gold/nickel alloy.

10. The method of claim 1, wherein the GaAs or Ge substrate has a bandgap higher than the bandgap of the first GaInNAsSb junction and the second GaInNAsSb junction.

11. The method of claim 1, wherein the first GaInNAsSb junction or the second GaInNAsSb junction comprises $Ga_{1-x}In_xN_yAs_{1-y-z}Sb_z$, wherein:
   $0 \leq x \leq 0.24$, $0.01 \leq y \leq 0.07$, and $0.001 \leq z \leq 0.20$;
   $0.02 \leq x \leq 0.24$, $0.01 \leq y \leq 0.07$, and $0.001 \leq z \leq 0.03$;
   $0.02 \leq x \leq 0.18$, $0.01 \leq y \leq 0.04$, and $0.001 \leq z \leq 0.03$;
   $0.08 \leq x \leq 0.18$, $0.025 \leq y \leq 0.04$, and $0.001 \leq z \leq 0.03$; or
   $0.06 \leq x \leq 0.20$, $0.02 \leq y \leq 0.05$, and $0.005 \leq z \leq 0.02$.

12. The method of claim 1, wherein the first tunnel junction or the second tunnel junction comprises $Ga_{1-x}In_xN_yAs_{1-y-z}Sb_z$, wherein:
   $0 \leq x \leq 0.18$, $0.01 \leq y \leq 0.05$, and $0.001 \leq z \leq 0.15$;
   $0 \leq x \leq 0.18$, $0.001 \leq y \leq 0.05$, and $0.001 \leq z \leq 0.03$;
   $0.02 \leq x \leq 0.18$, $0.005 \leq y \leq 0.04$, and $0.001 \leq z \leq 0.03$;
   $0.04 \leq x \leq 0.18$, $0.01 \leq y \leq 0.04$, and $0.001 \leq z \leq 0.03$;
   $0.06 \leq x \leq 0.18$, $0.015 \leq y \leq 0.04$, and $0.001 \leq z \leq 0.03$; or
   $0.08 \leq x \leq 0.18$, $0.025 \leq y \leq 0.04$, and $0.001 \leq z \leq 0.03$.

13. The method of claim 1, wherein the GaAs or Ge substrate is thinned to a thickness less than 50 microns, from 150 microns to 250 microns, or from 175 microns to 225 microns.

* * * * *